US006839283B1

(12) United States Patent
Futatsuyama et al.

(10) Patent No.: US 6,839,283 B1
(45) Date of Patent: Jan. 4, 2005

(54) NON-VOLATILE SEMICONDUCTOR MEMORY DEVICE WITH REDUCED CHIP REAL ESTATE AREA FOR TRANSFER TRANSISTORS

(75) Inventors: Takuya Futatsuyama, Yokohama (JP); Koji Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/692,799

(22) Filed: Oct. 27, 2003

(30) Foreign Application Priority Data

Jul. 18, 2003 (JP) ........................................ 2003-199374

(51) Int. Cl.$^7$ ............................................. G11C 16/12
(52) U.S. Cl. ........................... 365/185.23; 365/185.17; 365/185.12; 365/185.13; 365/185.11; 365/185.28; 365/51; 365/72
(58) Field of Search .................... 365/185.17, 185.12, 365/185.13, 185.11, 185.05, 185.23, 185.28, 51, 72, 63

(56) References Cited

U.S. PATENT DOCUMENTS

| 4,347,588 A | * | 8/1982 | Hoffmann et al. ........... 365/206 |
| 5,619,460 A | * | 4/1997 | Kirihata et al. .............. 365/201 |
| 6,507,508 B2 | | 1/2003 | Hosono et al. ................ 365/63 |

FOREIGN PATENT DOCUMENTS

JP        2002-141477        5/2002        .......... H01L/27/10

* cited by examiner

Primary Examiner—Andrew Q. Tran
(74) Attorney, Agent, or Firm—Oblon, Spivak, McClelland, Maier & Neustadt, P.C.

(57) ABSTRACT

A non-volatile semiconductor memory device, comprising a memory cell array including a plurality of electrically erasable programmable non-volatile memory cells arrayed and divided into a plurality of blocks; a plurality of word lines arranged in each of the plurality of blocks and each commonly connected to memory cells on an identical row; a plurality of drive lines provided corresponding to the plurality of word lines and each arranged to supply a voltage to the corresponding word line; a plurality of transfer transistors each operative as a switch to connect the corresponding word line to the corresponding drive line among the plurality of word lines and the plurality of drive lines, wherein said plurality of word lines are classified into an arbitrary word line determined arbitrarily, secondary adjacent word lines located adjacent to both word lines adjacent to the arbitrary word line, and residual word lines other than said arbitrary word line and the secondary adjacent word lines, and wherein among the plurality of transfer transistors, transfer transistors for the residual word lines are arranged at both adjacent locations and an opposite location around a transfer transistor for the arbitrary word line.

14 Claims, 20 Drawing Sheets

NON-VOLATILE SEMICONDUCTOR MEMORY DEVICE WITH REDUCED CHIP REAL ESTATE AREA FOR TRANSFER TRANSISTORS

CROSS-REFERENCE TO RELATED APPLICATION

This application is based upon and claims the benefit of priority from the prior Japanese Patent Application No. 2003-199374, filed on Jul. 18, 2003; the entire contents of which are incorporated herein by reference.

BACKGROUND OF THE INVENTION

1. Field of the Invention

The present invention relates to an electrically erasable programmable non-volatile semiconductor memory device, for example, a NAND-type EEPROM.

2. Description of the Related Art

An electrically erasable programmable read-only memory (EEPROM) has been known in the art as one of semiconductor memories. For example, a NAND-type EEPROM including NAND cells has received attention because it can be highly integrated. Each NAND cell consists of a plurality of serially connected memory cells, each of which is the unit of one bit memory. The NAND-type is utilized in a memory card to store image data output from a digital still camera, for example.

The memory cell in the NAND-type EEPROM has an FET-MOS structure that includes a floating gate and a word line layered via insulators on a semiconductor substrate that provides a channel region. The NAND cell includes a plurality of memory cells serially connected in such a manner that they share a source/drain between neighbors. The source/drain corresponds to an impurity region that functions as at least one of a source and a drain.

An exemplary method of programming data in the NAND-type is described simply.

(1) "0" Program

While a channel region is kept at a voltage of 0V, a word line corresponding to a memory cell for "0" program is selected, and a voltage of 20V is applied to the word line. In addition, a voltage, for example, of 10V is applied to the word lines other than the selected word line. Because of a large potential difference between the selected word line and the channel region, electrons are injected through the tunnel current into the floating gate of the memory cell. As the result, the threshold of the memory cell turns to a positive state ("0" programmed state).

(2) "1" Program

After the channel region is set in a floating state at a certain voltage above 0V, a word line corresponding to a memory cell for "1" program is selected, and a voltage of 20V is applied to the word line likewise "0" program. In addition, a voltage, for example, of 10V is applied to the word lines other than the selected word line. As a result, the voltage on the channel region is boosted up, for example, to 8V through capacitive coupling with the selected word line. In this case, different from "0" program, because of a small potential difference between the selected word line and the channel region, few electrons are injected through the tunnel current into the floating gate of the memory cell for "1" program. Therefore, the threshold of the memory cell is retained in a negative state ("1" programmed state).

For "1" program, if the elevation of the voltage on the channel region is small, the tunnel current injects electrons into the floating gate, resulting in "0" program. In order to prevent such the failed program, in another exemplary programming method, a voltage of 0V is applied to two word lines both located adjacent to the word line for the memory cell for "1" program to increase the voltage elevation on the channel region.

The word lines are provided with respective transfer transistors. This transistor is employed to apply a voltage to the word line. According to the other exemplary programming method, the selected word line is set at 20V, the both adjacent word lines at 0V, and other word lines at 10V for programming. Therefore, transfer transistors may be required to supply 20V, 10V and 0V to the corresponding word lines.

A device isolation insulator for use in isolation between transfer transistors is required to have such a breakdown voltage that is determined based on the largest potential difference between adjacent transistors, specifically a potential difference when one of the adjacent transistors is set at 20V and the other at 0V. Therefore, compared to the exemplary programming method that does not utilize 0V, the device isolation insulator is required to have a higher breakdown voltage. This requirement increases the dimension of the device isolation insulator, and accordingly increases the area of a region to locate the transfer transistor (that is, an area of a row decoder). A technology has been known to devise arrangement of the transfer transistors to prevent such the problem (for example, Japanese Patent Application laid-Open No. 2002-141477, FIGS. 1 and 2).

SUMMARY OF THE INVENTION

The present invention has an object to provide a non-volatile semiconductor memory device that has a reduced area of a region to locate a transfer transistor, an electronic card that includes the memory device mounted thereon, and an electronic device that utilizes the electronic card.

The non-volatile semiconductor memory device according to an aspect of the present invention comprises a memory cell array including a plurality of electrically erasable programmable non-volatile memory cells arrayed and divided into a plurality of blocks; a plurality of word lines arranged in each of the plurality of blocks and each commonly connected to memory cells on an identical row; a plurality of drive lines provided corresponding to the plurality of word lines and each arranged to supply a voltage to the corresponding word line; a plurality of transfer transistors each operative as a switch to connect the corresponding word line to the corresponding drive line among the plurality of word lines and the plurality of drive lines, wherein the plurality of word lines are classified into an arbitrary word line determined arbitrarily, secondary adjacent word lines located adjacent to both word lines adjacent to the arbitrary word line, and residual word lines other than the arbitrary word line and the secondary adjacent word lines, and wherein among the plurality of transfer transistors, transfer transistors for the residual word lines are arranged at both adjacent locations and an opposite location around a transfer transistor for the arbitrary word line.

BRIEF DESCRIPTION OF THE DRAWINGS

The present invention will be more fully understood from the following detailed description with reference to the accompanying drawings, in which.

DETAILED DESCRIPTION OF THE EMBODIMENTS

Figure 1:
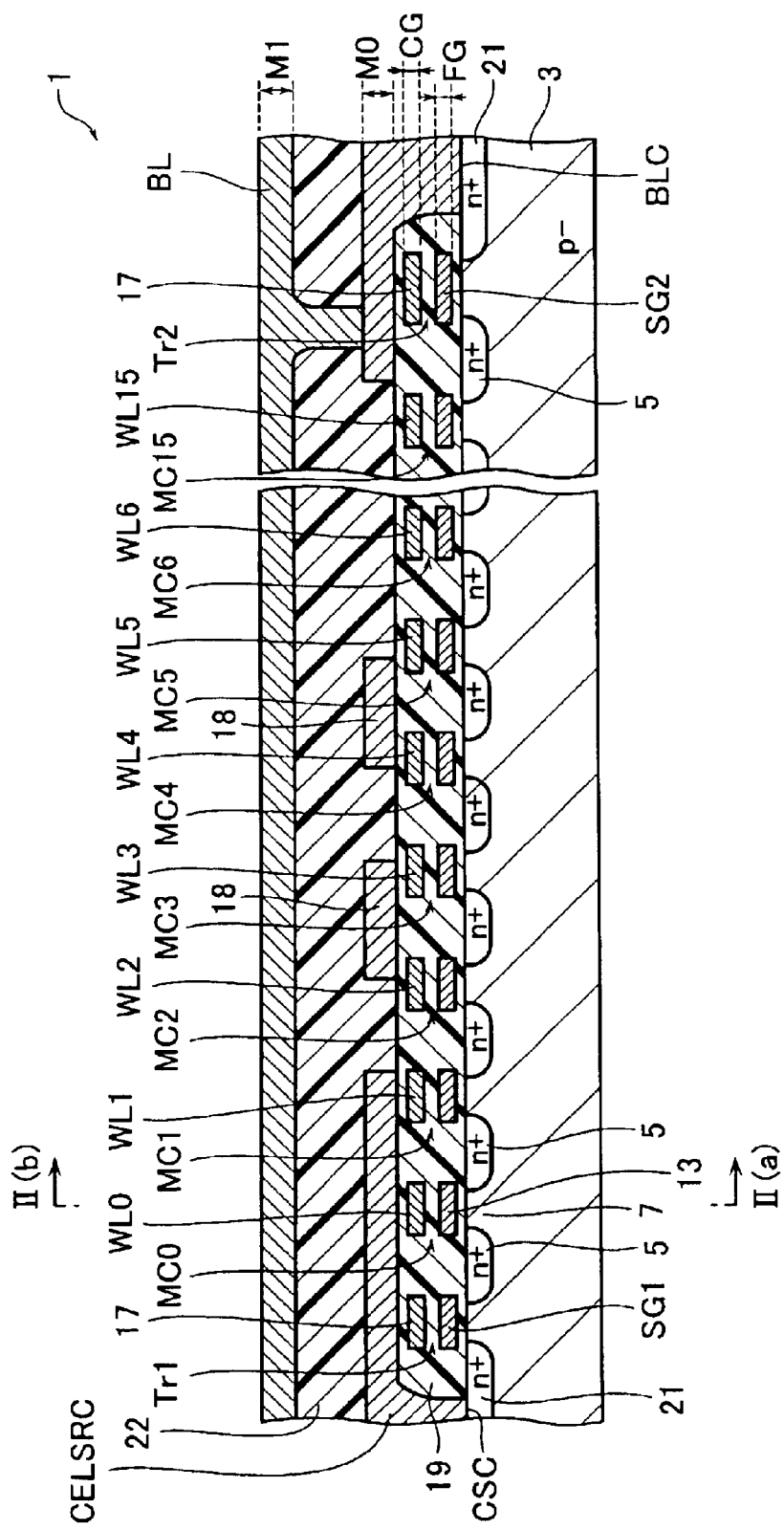
FIG. 1 is a schematic cross-sectional view of a NAND cell contained in a NAND-type EEPROM according to a first embodiment.

The present invention will be described in accordance with the items as classified below:

FIRST EMBODIMENT
1. Structure of NAND cell
2. Operation of NAND cell
   (1) Typical Exemplary NAND Cell Operation
   (2) Comparative Example
   (3) Exemplary NAND Cell Operation According to First Embodiment
3. Characteristics of First Embodiment
   (Characteristic 1)
   (Characteristic 2)
   (Characteristic 3)
   (Characteristic 4)
   (Characteristic 5)
SECOND EMBODIMENT
THIRD EMBODIMENT
APPLICATIONS TO ELECTRONIC CARD AND ELECTRONIC DEVICE In the figures illustrative of the embodiments, the same parts as those once explained are given the same reference numerals to omit further explanations.

FIRST EMBODIMENT

1. Structure of NAND cell

Figure 2:
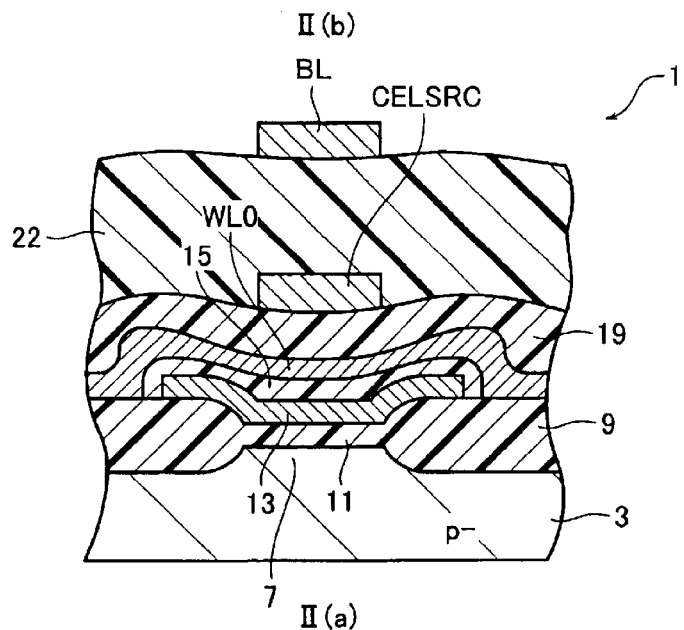
FIG. 2 is a schematic view of a II(a)-II(b) section in FIG. 1.
Figure 3:
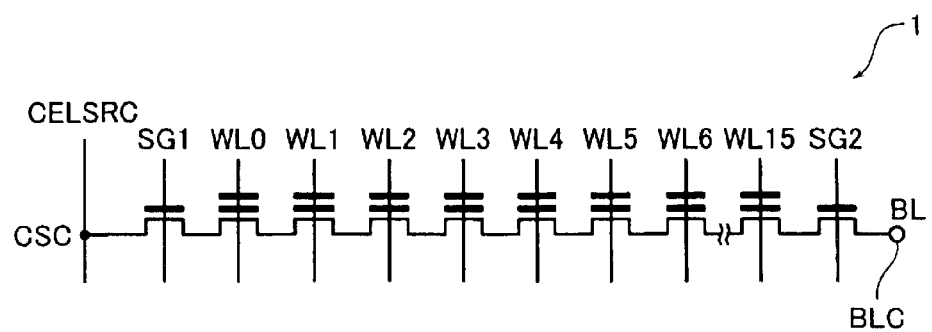
FIG. 3 is an equivalent circuit diagram of the NAND cell in FIG. 1.

FIG. 1 is a schematic cross-sectional view of a NAND cell contained in a NAND-type EEPROM according to the first embodiment. FIG. 2 is a schematic view of a II(a)-II(b) section in FIG. 1. FIG. 3 is an equivalent circuit diagram of the NAND cell in FIG. 1.

As shown in FIGS. 1–3, a NAND cell 1 has a structure including 16 memory cells MC0–15 formed in a p-type semiconductor substrate 3. The memory cells are non-volatile cells that are electrically data-erasable and-programmable. Each memory cell has the same configuration. For example, in the memory cell MC0, an $n^+$-type impurity region (source/drain) 5 is formed in a surface of the substrate 3 at a certain pitch. A channel region 7 is located between the impurity regions 5 in the substrate 3. A device isolation insulator 9 is formed around the regions 5 and 7. A floating gate 13 is formed via a gate insulator 11 above the channel region 7. Finally, a word line WL is formed via an insulator 15 above the floating gate 13. A floating gate layer FG indicates a conductive layer that includes the floating gate 13 formed therein. A control gate layer CG indicates a conductive layer that includes parts of the word lines WL0–15 formed as the control gates.

The NAND cell 1 includes 16 serially connected memory cells sharing a source/drain between neighbors. The number of memory cells for configuring the NAND cell 1 may be equal to 8, 32, 64 or the like though it is exemplified as 16.

Formed close to the memory cell MC0 is a selection transistor Tr1 that has a selection gate line SG1. An end of the current path in the transistor Tr1 is connected via the impurity region 5 to an end of the current path in the memory cell MC0. The selection transistor Tr1 is employed to control connection and disconnection between the NAND cell 1 and a source line CELSRC.

Formed close to the memory cell MC15 is, on the other hand, a selection transistor Tr2 that has a selection gate line SG2. In the selection transistor Tr2, an end of the current pass is connected via the impurity region 5 to an end of the current path in the memory cell MC15. The transistor Tr2 is employed to control connection and disconnection between the NAND cell 1 and a bit line BL. The selection transistor Tr1, the memory cells MC0-15 and the selection transistor Tr2 are connected in series to form a serially connected current path having one end connected to the bit line BL and the other end connected to the source line CELSRC. Disposed above the selection gate lines SG1–2 is a conductive film 17, which may be connected to the selection gate lines SG1–2 or be floated.

A first interlayer insulator 19 is formed over the memory cells MC0-15 and the selection transistors Tr1–2. A first conductive layer M0 is formed on the first interlayer insulator 19. The conductive layer M0 includes an intermediate connection wiring layer for the bit lines, and shunt wires 18 for the source line CELSRC and the selection gate lines SG1, SG2, for example. The source line CELSRC is connected to the one end of the current path in the transfer transistor Tr1, that is an n$^+$-type impurity region 21 formed in the semiconductor substrate 3. This connection point is called Cell-Source Contact CSC.

A second interlayer insulator 22 is formed over the first conductive layer M0. A second conductive layer M1 is formed on the second interlayer insulator 22. The layer M1 includes the bit line BL that extends in a direction crossing the word lines WL0–15. The bit line BL is connected to the one end of the current path in the transfer transistor Tr2, that is another n$^+$-type impurity region 21 formed in the semiconductor substrate 3. This connection point is called Bit Line Contact BLC. The NAND cell 1 may be formed in a p-type well in the semiconductor substrate 3.

Figure 4:
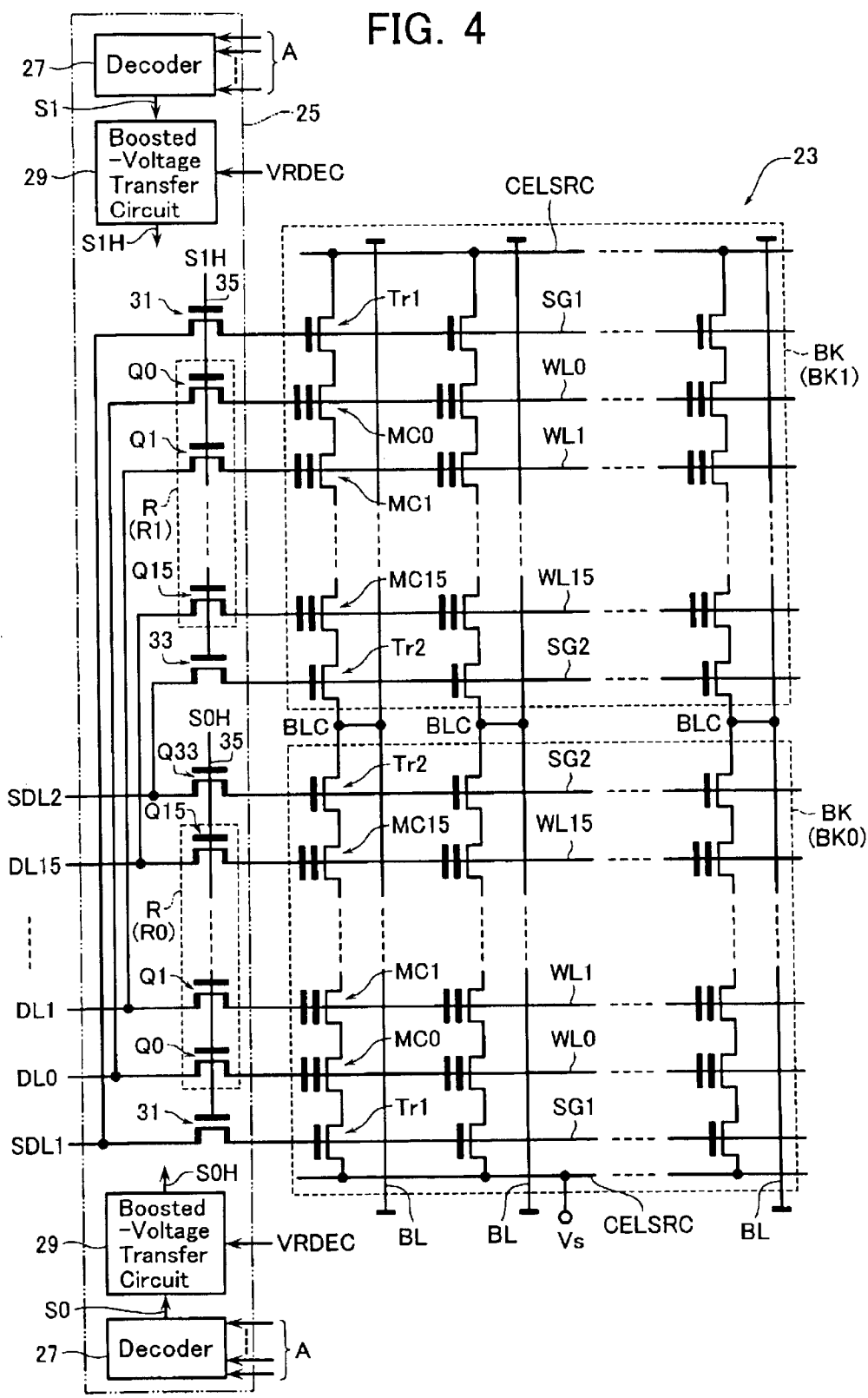
FIG. 4 is an equivalent circuit diagram of part of a memory cell array and part of a row decoder according to the first embodiment.

NAND cells 1 are arranged in matrix (an example of array) to configure a memory cell array. FIG. 4 is an equivalent circuit diagram of part of a memory cell array 23 and part of a block selector 25. The memory cell array 23 is divided into a plurality of blocks BK. A region surrounded by a dot line in FIG. 4 indicates one block BK. In general, operation of read or program is performed after one block is selected from the plurality of blocks BK.

The word lines WL0–15 are arranged in every block BK. Each word line is connected commonly to memory cells on an identical row in the blocks BK. The selection gate lines SG1–2 are each connected commonly to the selection transistors on an identical row in the blocks BK. The plurality of bit lines BL can be connected to NAND cells on an identical column in the memory cell array 23.

The block selector 25 is an ensemble of row decoders, which is employed to select one block BK that contains a target memory cell for program for example, from the plurality of blocks BK. The block selector 25 includes a transfer transistor region R that is a region to locate a transfer transistor therein, as well as a decoder 27 and a boosted voltage transfer section 29.

The transfer transistor region R is provided in every block BK. The region R includes 16 transfer transistors Q0–15 arranged therein. The transistor Q0–15 has one source/drain (first impurity region) connected to the corresponding word line WL0–15 and the other source/drain (second impurity region) connected to the corresponding drive line DL0–15. The drive line DL0–15 is employed to supply power to the corresponding word line. The transfer transistor Q0–15 serves as a switch for connecting the word line WL0–15 with the drive line DL0–15.

Each block BK includes transistors 31, 33 that transfer voltages to the selection gates SG1–2. The transistors 31, 33 serve as switches for connecting the selection gate SG1–2 with selection gate drive lines SDL1–2. The transfer transistor Q0–15 and the transistors 31, 33 have gates commonly connected to a gate line 35.

A part of a row address signal is employed as a signal A to select a block BK. The signal A is fed to the decoder 27. When the decoder 27 decodes the signal A, the block BK is selected. The decoder 27 provides a block selection signal corresponding to the selected block BK. The block selection signal is sent to the boosted voltage transfer circuit 29. A VRDEC voltage (of 22V, for example) is supplied to the circuit 29. The circuit 29 controls the supply of power required to turn on the transfer transistors Q0–15 and the transistors 31, 33 based on the block selection signal.

For example, when the selected block BK is the block BK0, the block selection signal S0 output from the decoder 27 for BK0 is boosted at the boosted voltage transfer circuit 29. The boosted block selection signal S0H is supplied to the gate line 35 in the region R0 to turn on the transfer transistors Q0–15 and the transistors 31, 33 in the region R0. As a result, the word lines WL0–15 are connected with the drive lines DL0–15, and the selection gates SG1–2 are connected with the selection gate drive lines SDL1–2 in the region R0.

To the contrary, the gate line 35 is grounded in the transfer transistor region R corresponding to a non-selected block BK. Therefore, the transfer transistors Q0–15 and the transistor 31, 33 in the region R remain off.

If the row address signal is pre-decoded, the decoder 27 may receive the pre-decoded signal A. Pre-decoding of the row address signal can reduce the number of wires provided with H level signals, and accordingly lower the power consumption.

2. Operation of NAND Cell

Prior to beginning of description on the NAND cell operation according to the first embodiment, (1) Typical Exemplary NAND Cell Operation and (2) Comparative Example are described first to provide understanding of the operation. Then, (3) Exemplary NAND Cell Operation According to First Embodiment is described.

(1) Typical Exemplary NAND Cell Operation

Figure 5:
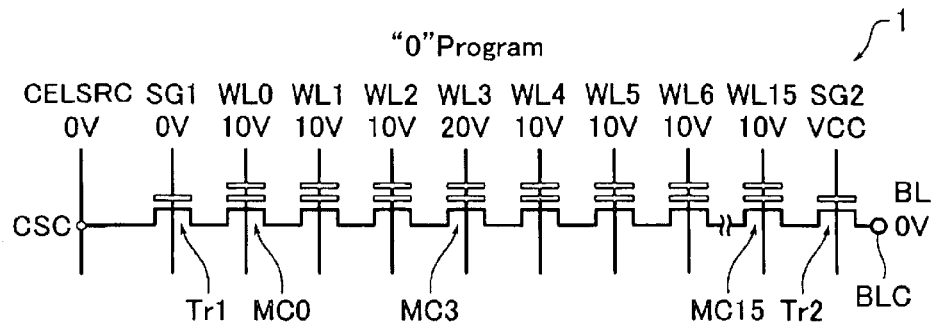
FIG. 5 is an equivalent circuit diagram of the NAND cell containing a memory cell for "0" program in a typical example of NAND cell programming.
Figure 6:
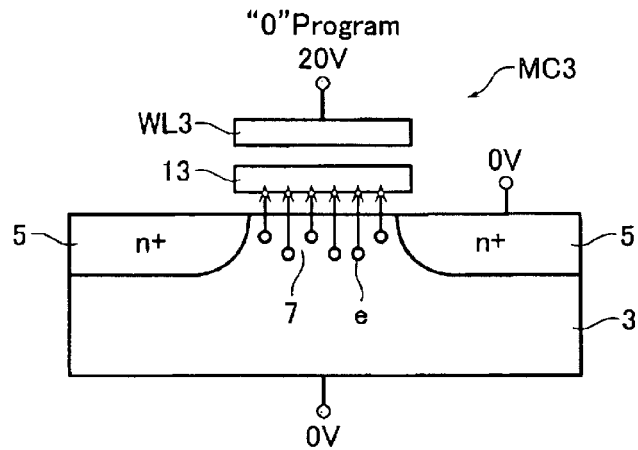
FIG. 6 is a schematic view of the memory cell for "0" program in FIG. 5.
Figure 7:
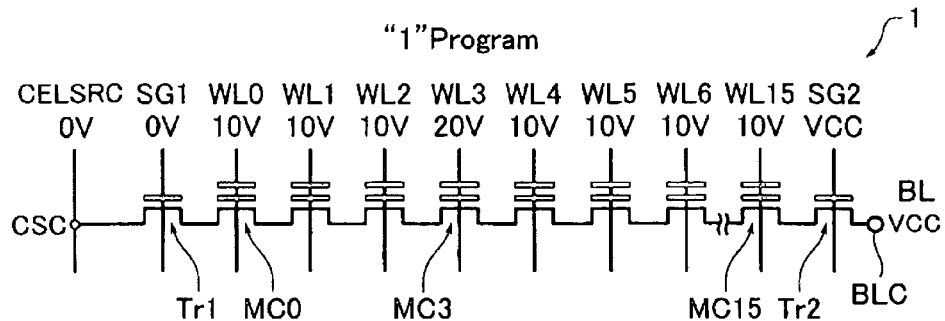
FIG. 7 is an equivalent circuit diagram of the NAND cell containing a memory cell for "1" program in a typical example of NAND cell programming.
Figure 8:
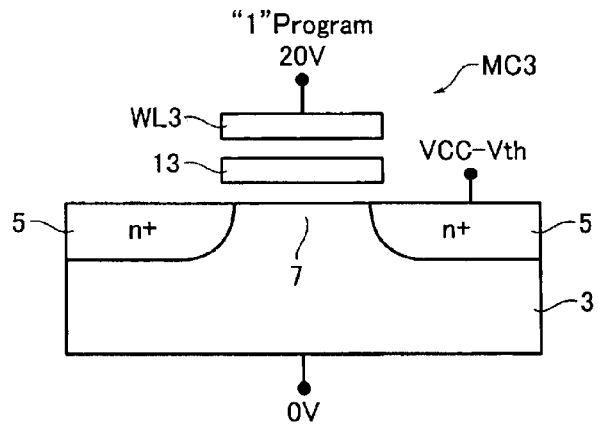
FIG. 8 is a schematic view of the memory cell for "1" program in FIG. 7.

Operation of program is described with reference to FIGS. 5–8. FIG. 5 is an equivalent circuit diagram of the NAND cell containing a memory cell for "0" program, and FIG. 7 is that for "1" program. The NAND cell 1 in FIGS. 5 and 7 is the same as the NAND cell 1 in FIG. 3. FIG. 6 is a schematic view of the memory cell for "0" program, and FIG. 8 is that for "1" program.

Program is performed after the NAND cell 1 is erased or the threshold of each cell in the NAND cell 1 is turned into a negative state. Program is performed in an order beginning from the memory cell MC0 arranged at a farthermost location from the bit line contact BLC, that is the memory cell close to the source line CELSRC. An example of programming the memory cell MC3 is described below.

For "0" program, as shown in FIGS. 5 and 6, VCC (supply voltage) is applied to the selection gate line SG2 to turn on the selection transistor Tr2, and 0V (ground voltage) is applied to the bit line BL. The selection gate line SG1 is at 0V, which keeps the selection transistor Tr1 off.

Then, a high voltage (approximately 20V) is applied to the word line WL3 for the memory cell MC3, and an intermediate voltage (approximately 10V) is applied to other word lines. The voltage on the bit line BL is equal to 0V and accordingly transferred to the channel region 7 in the selected memory cell MC3. Thus, the voltage on the channel region 7 is kept at 0V.

Because of a large potential between the word line WL3 and the channel region 7, electrons e due to the tunnel current are injected into the floating gate 13 of the memory cell MC3. As a result, the threshold voltage of the memory cell MC3 turns into a positive state ("0" programmed state).

On the other hand, for "1" program, FIGS. 7 and 8 are employed to describe mainly on different points from "0" program. First, VCC (supply voltage), for example, is applied to the bit line BL. As the voltage on the selection gate line SG2 is equal to VCC, when the voltage on the channel region 7 reaches VCC minus Vth (VCC−Vth; Vth denotes the threshold voltage of the selection transistor Tr2), the selection transistor Tr2 is cut off. Therefore, the channel region 7 turns into a floating state at the voltage of VCC−Vth.

When a voltage of 20V is applied to the word line WL3 and 10V to other word lines, the voltage on the channel region 7 is boosted from VCC-Vth up to 8V, for example, through capacitive coupling between each word line and the channel region 7.

As the voltage on the channel region 7 is boosted to a high voltage, the word line WL3 and the channel region 7 have a small potential therebetween, different from "0" program. Accordingly, no electrons due to the tunnel current are injected into the floating gate 13 of the memory cell MC3. Therefore, the threshold voltage of the memory cell is retained in a negative state ("1" programmed state).

When programming is performed to a batch of memory cells commonly connected to one word line (for example, simultaneous programming of 2 k-byte or 512-byte data), a faster programming can be achieved.

In the typical exemplary NAND cell operation, erasing is described next. Erase is simultaneously performed to all memory cells in the selected NAND-cell block BK (FIG. 4). While all word lines in the selected block BK are kept at 0V, a high voltage (of 22V, for example) is applied to the semiconductor substrate 3 (FIG. 1) (or a p-type-well when the NAND cell is formed in the p-type well). On the other hand, the bit lines, the source lines, the word lines in non-selected blocks, and all selection gate lines are floated. Consequently, in all memory cells in the selected block BK, electrons in the floating gates are extracted as the tunnel current to the semiconductor substrate. As a result, the threshold voltages of these memory cells are shifted toward negative.

As for operation of read, word lines for memory cells in the block selected for read are set at 0V, for example. In addition, VCC (supply voltage) or an intermediate voltage for read, VREAD, slightly higher than VCC is applied to word lines and selection gate lines for memory cells in blocks that are not selected for read. Under this condition, it is detected if current flows into the memory cell selected for read.

(2) Comparative Example

Figure 9:
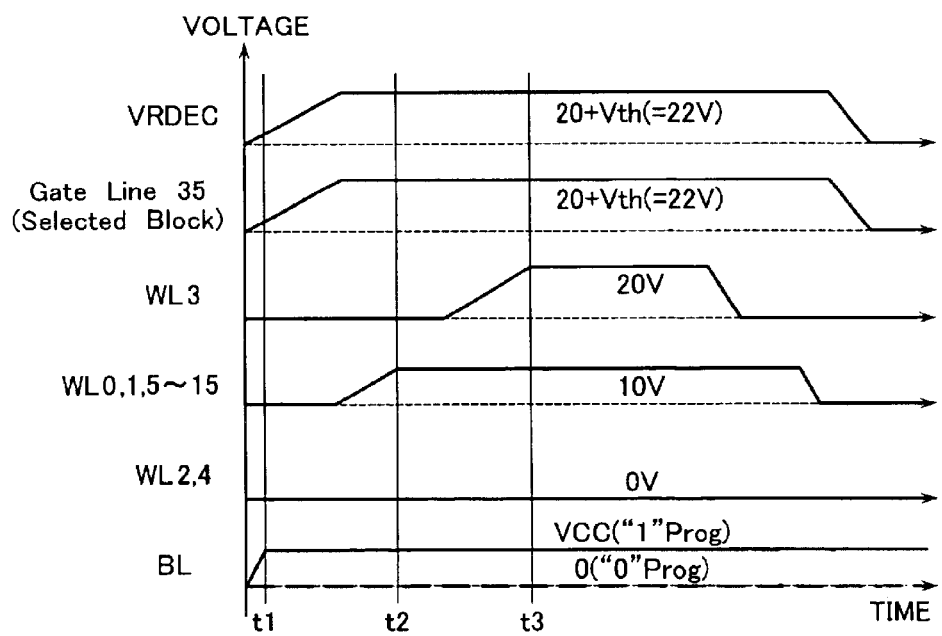
FIG. 9 is a timing chart illustrative of programming in a comparative example.
Figure 10:
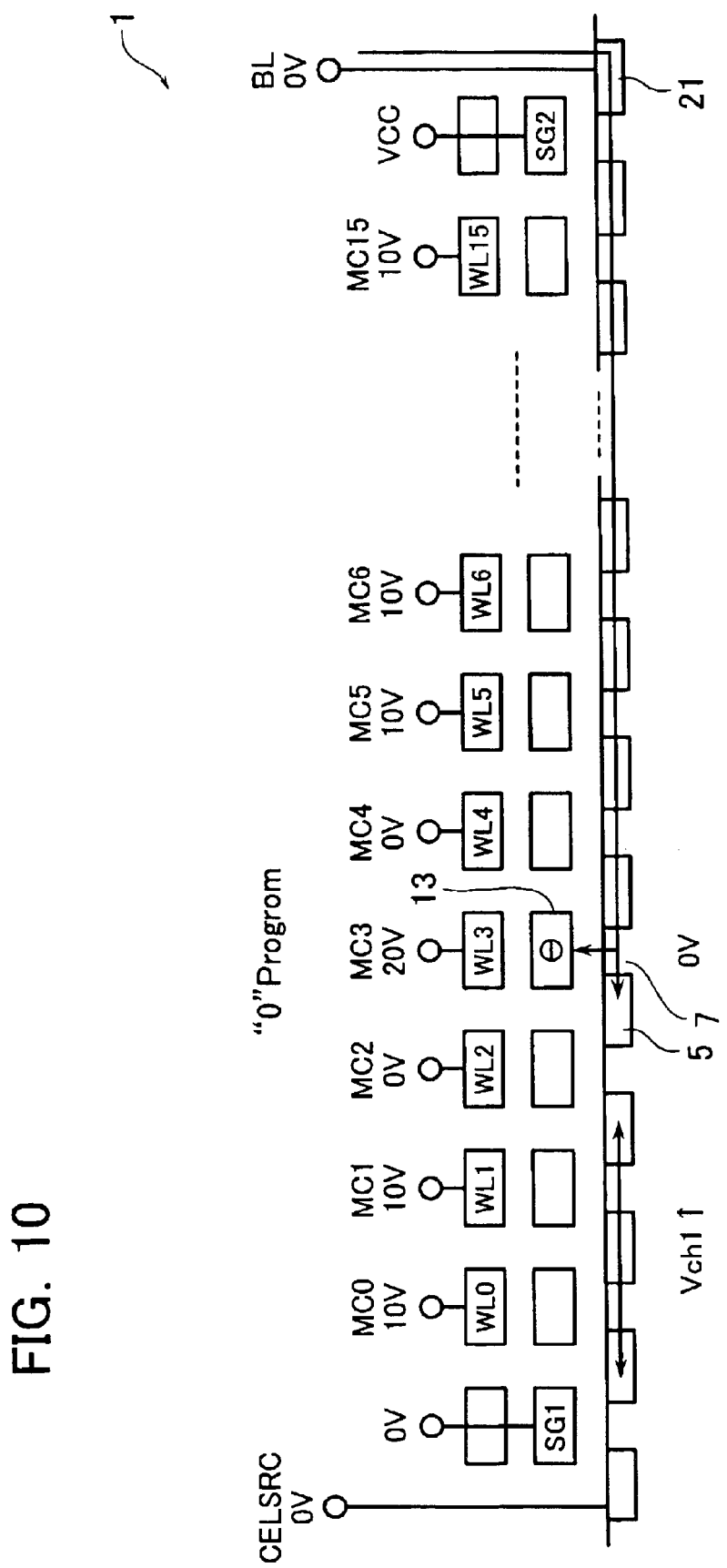
FIG. 10 is a schematic view of a NAND cell containing a memory cell for "0" program in the comparative example.
Figure 11:
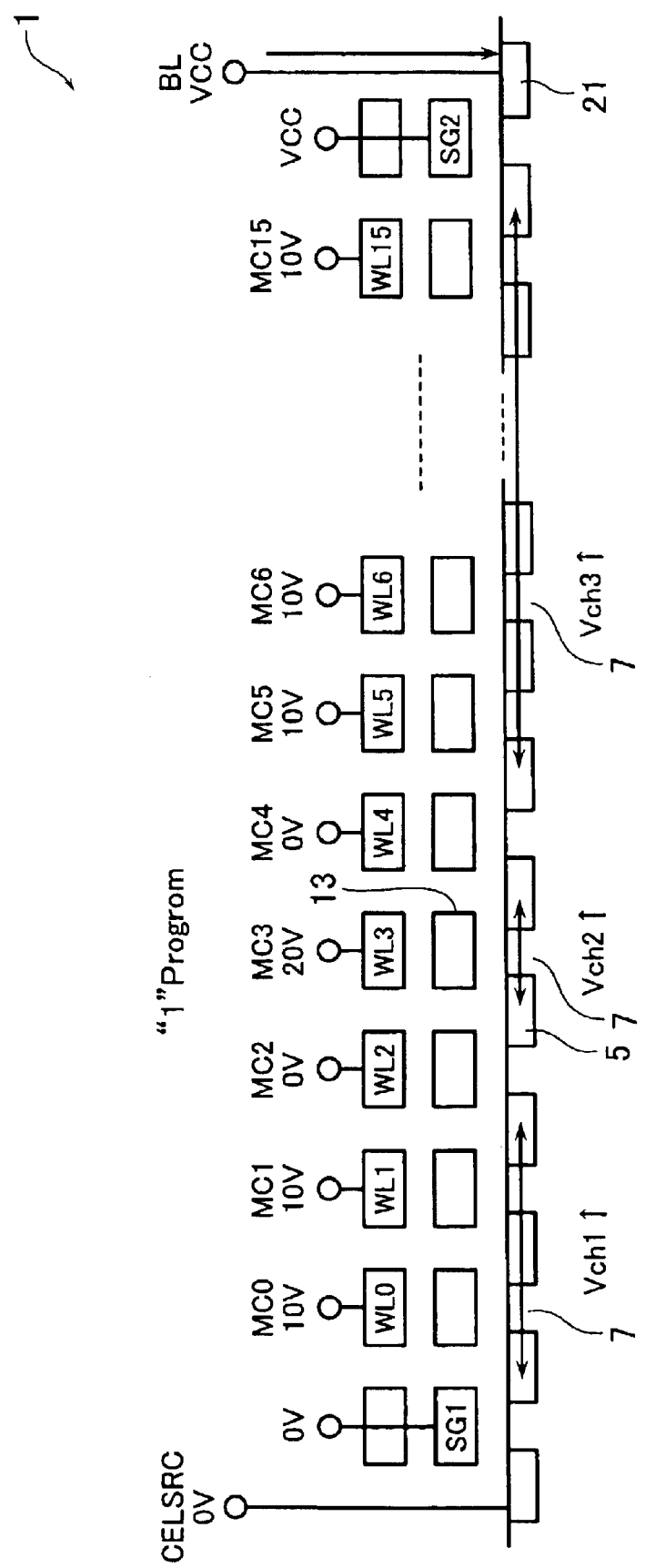
FIG. 11 is a schematic view of a NAND cell containing a memory cell for "1" program in the comparative example.

FIG. 9 is a timing chart illustrative of programming in a comparative example. FIG. 10 is a schematic view of a NAND cell containing a memory cell for "0" program in the comparative example, and FIG. 11 is for "1" program. The comparative example is mainly described on different points from the typical exemplary NAND cell operation.

As shown in FIGS. 9 and 10, for "0" program, the voltages on two word lines WL2, WL4 both located adjacent to the word line WL3 are kept at 0V. The memory cells MC3–15, having thresholds of negative voltage, become conductive to the bit line BL. Accordingly, in these memory cells, voltages on the channel regions 7 are equal to 0V. When a voltage of 20V is applied to the word line WL3, electrons e due to the tunnel current are injected into the floating gate 13 of the memory cell MC3 like the typical exemplary operation shown in FIG. 6. Thus, the threshold voltage of the memory cell MC3 turns into a positive state ("0" programmed state).

As for "1" program, as shown in FIGS. 9 and 11, the voltages on the word lines WL2, WL4 both located adjacent to the word line WL3 are kept at 0V like "0" program. At the time of t1, the voltage on the bit line BL is raised to VCC. Consequently, the channel region 7 turns into a floating state at a voltage of VCC-Vth as described in the typical exemplary operation.

At the time of t2, the voltages on the word lines WL0, 1, 5–15 are elevated to 10V. This voltage elevation boosts the voltages on the channel regions 7 in the memory cells MC0–15 through capacitive coupling. In a detailed description, the voltages on the channel regions 7 in the memory cells MC0–1 are elevated up to Vch1, and the voltages on the channel regions 7 in the memory cells MC5–15 are elevated up to Vch3. The word lines WL2, 4 are kept at 0V, and the voltage on the word line WL3 at this moment is also equal to 0V. Accordingly, the channel region 7 in the memory cell MC3 is provided with no voltage elevation from the word lines WL2–4. The channel region 7 in the memory cell MC3, however, is provided with a voltage elevation to Vch2 as the voltages on the channel regions at both sides elevate to Vch1, 3. Vch2 is approximately equal to |Vth|, a magnitude with a voltage drop of the lager threshold voltage of the memory cell MC2, 4.

At the time of t3, the voltage on the word line WL3 is raised up to 20V to further boost the voltage on the channel region 7 in the memory cell MC3 from Vch2. This results in a reduced potential between the word line WL3 and the channel region 7 in the memory cell MC3. Therefore, electron injection due to the tunnel current can not occur in the floating gate 13 of the memory cell MC3. Accordingly, the threshold voltage of the memory cell MC3 is kept in a negative state ("1" programmed state).

In a word, if the voltage elevation on the channel region is small for "1" program, the electron injection into the floating gate due to the tunnel current results in a "0" programmed state. In order to prevent this failed program, in the comparative example, a voltage of 0V is applied to the two word lines both located adjacent to the word line for the memory cell for "1" program to increase the voltage elevation on the channel region.

(3) Exemplary NAND Cell Operation According to First Embodiment

Figure 12:
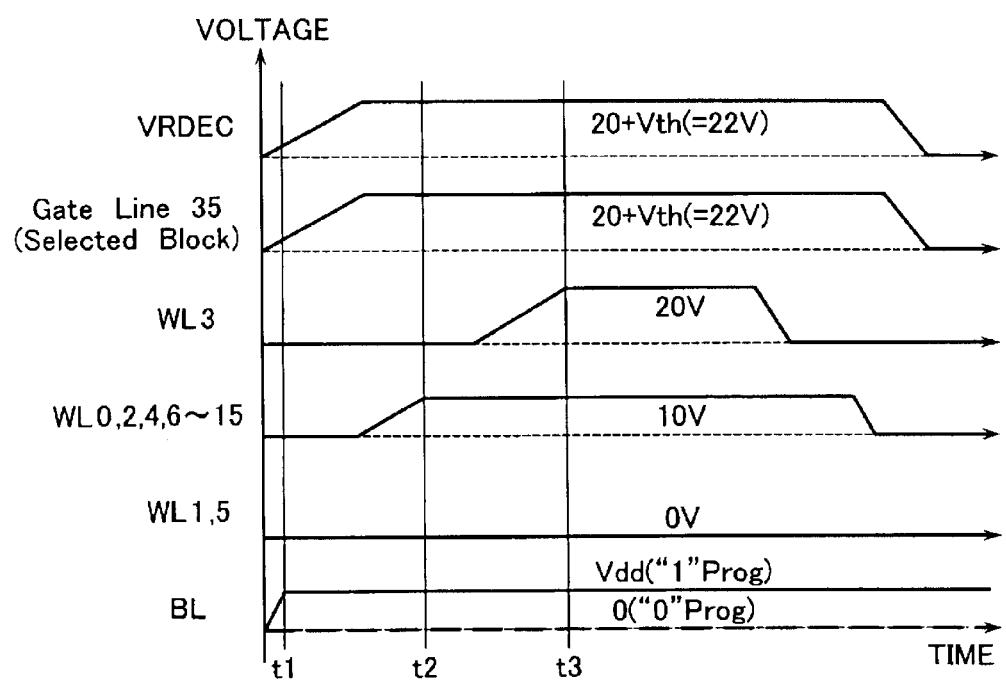
FIG. 12 is a timing chart illustrative of programming in examples of operation of the first embodiment.
Figure 13:
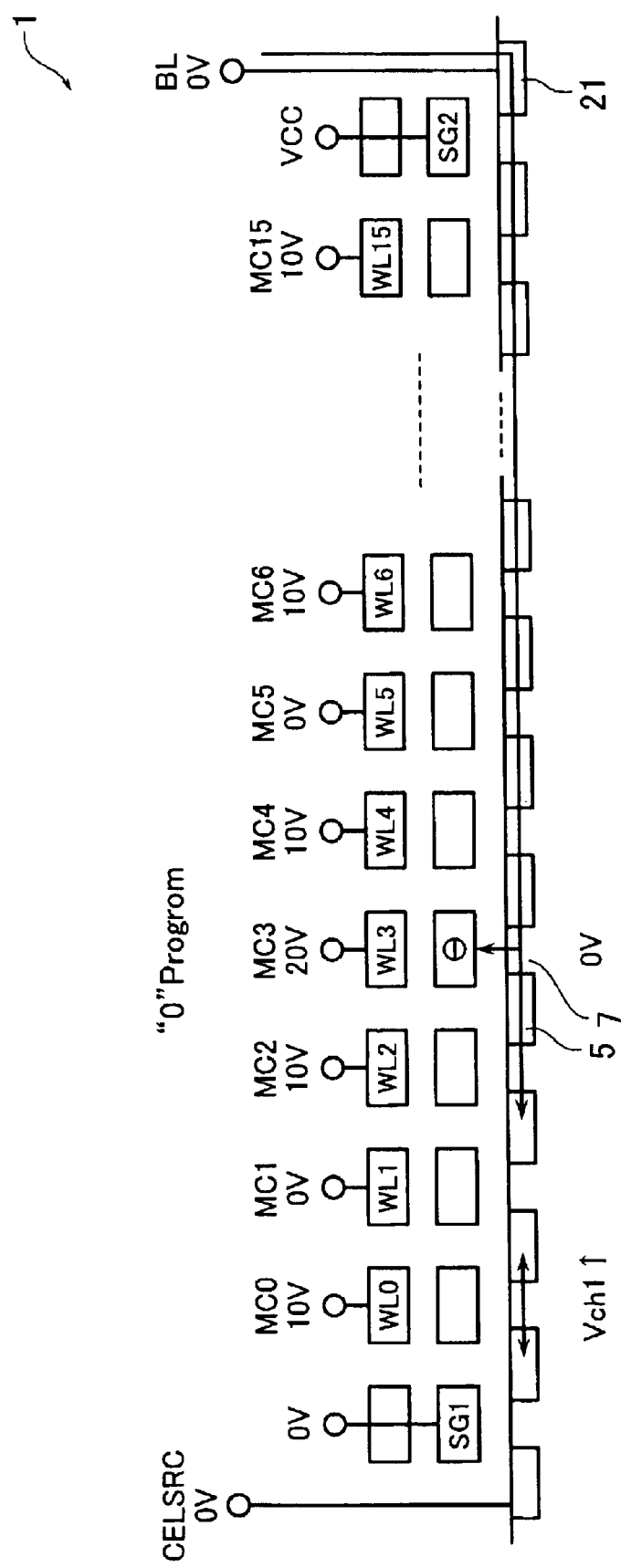
FIG. 13 is a schematic view of the NAND cell containing the memory cell for "0" program in FIG. 12.
Figure 14:
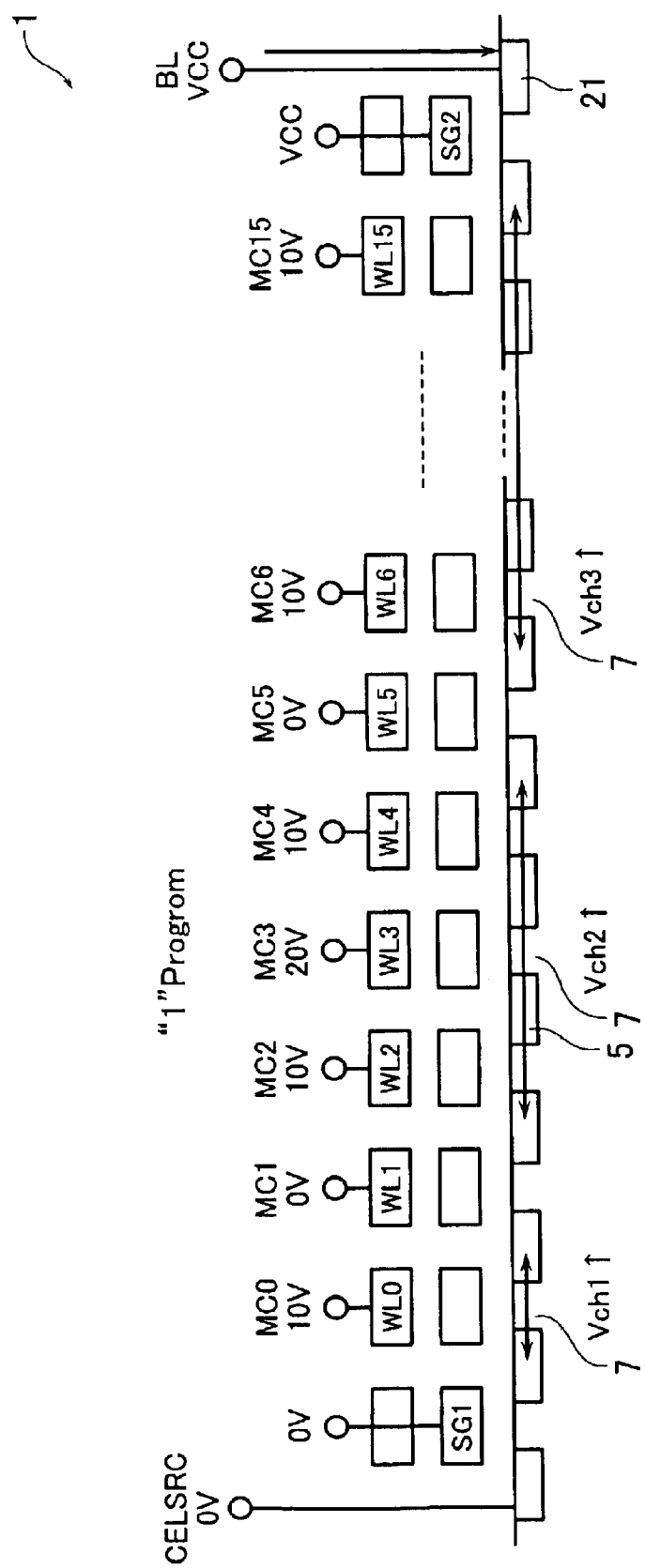
FIG. 14 is a schematic view of the NAND cell containing the memory cell for "1" program in FIG. 12.

The exemplary NAND cell operation according to the first embodiment is described with reference to FIGS. 12–14 mainly on different points from the comparative example. FIG. 12 is a timing chart illustrative of programming in the exemplary operation of the first embodiment, which corresponds to FIG. 9. FIG. 13 is a schematic view of the NAND cell containing the memory cell for "0" program, which corresponds to FIG. 10. FIG. 14 is that for "1" program, which corresponds to FIG. 11.

In the first embodiment, the voltages are kept at 0V on the word lines WL1, 5 (an example of the secondary adjacent word lines) located adjacent to the word lines WL2, 4 both adjacent to the word line WL3 (an example of the arbitrary word line). Others are similar to those in the comparative example.

The first embodiment has an advantage as described below. For "0" program as shown in FIG. 13, the voltages on the word lines WL2, 4 are set at 10V. Thus, the potentials on the floating gates in the memory cells MC2, 4 are elevated through capacitive coupling, different from the comparative example. This potential elevation boosts the potential on the floating gate in the memory cell MC3 located between the memory cells MC2, 4. Therefore, programming of the memory cell MC3 can be accelerated and accordingly the voltage applied to the word line WL3 can be lowered. As a result, it is possible to reduce the width of the device isolation insulator for the transfer transistor region R (FIG. 4), the area of the region R, and the area occupied by the row decoder.

On the other hand, for "1" program as shown in FIG. 14, the effect on prevention of failed program can be enhanced compared to the comparative example. In a detailed explanation, for "1" program, the potential on the channel region 7 in the memory cell MC3 is elevated to Vch2. In this case, however, the potential on the channel region 7 lowers due to the leakage current from the channel region 7 of the memory cell MC3. If the programming is continued in the situation with the lowered potential, the failed program may be resulted. Accordingly, the time period for applying the voltage to the word line WL3 is limited from the viewpoint of the leakage current. In the first embodiment, the potentials on the channel regions 7 are equal to Vch2 in both adjacent memory cells MC2, 4 in addition to the memory cell MC3, resulting in the larger capacitance of channel regions 7 compared with the comparative example. Therefore, a longer time is required to lower the potential by the leakage current, and the failed program may be hardly caused.

3. Characteristics of First Embodiment (Characteristic 1)

As described above, in the programming method of the first embodiment, the word line WL3 may be the word line connected to a memory cell for programming data therein, for example. In this case, the voltages are kept at 0V on the word lines WL1, 5 located adjacent to the word lines WL2, 4 both adjacent to the word line WL3 to program data in the memory cell. In the programming method, the first embodiment has a characteristic in the devised layout of the transfer transistors Q0–15 to reduce the area of the transfer transistor region R of FIG. 4. This characteristic is detailed below.

Figure 15:
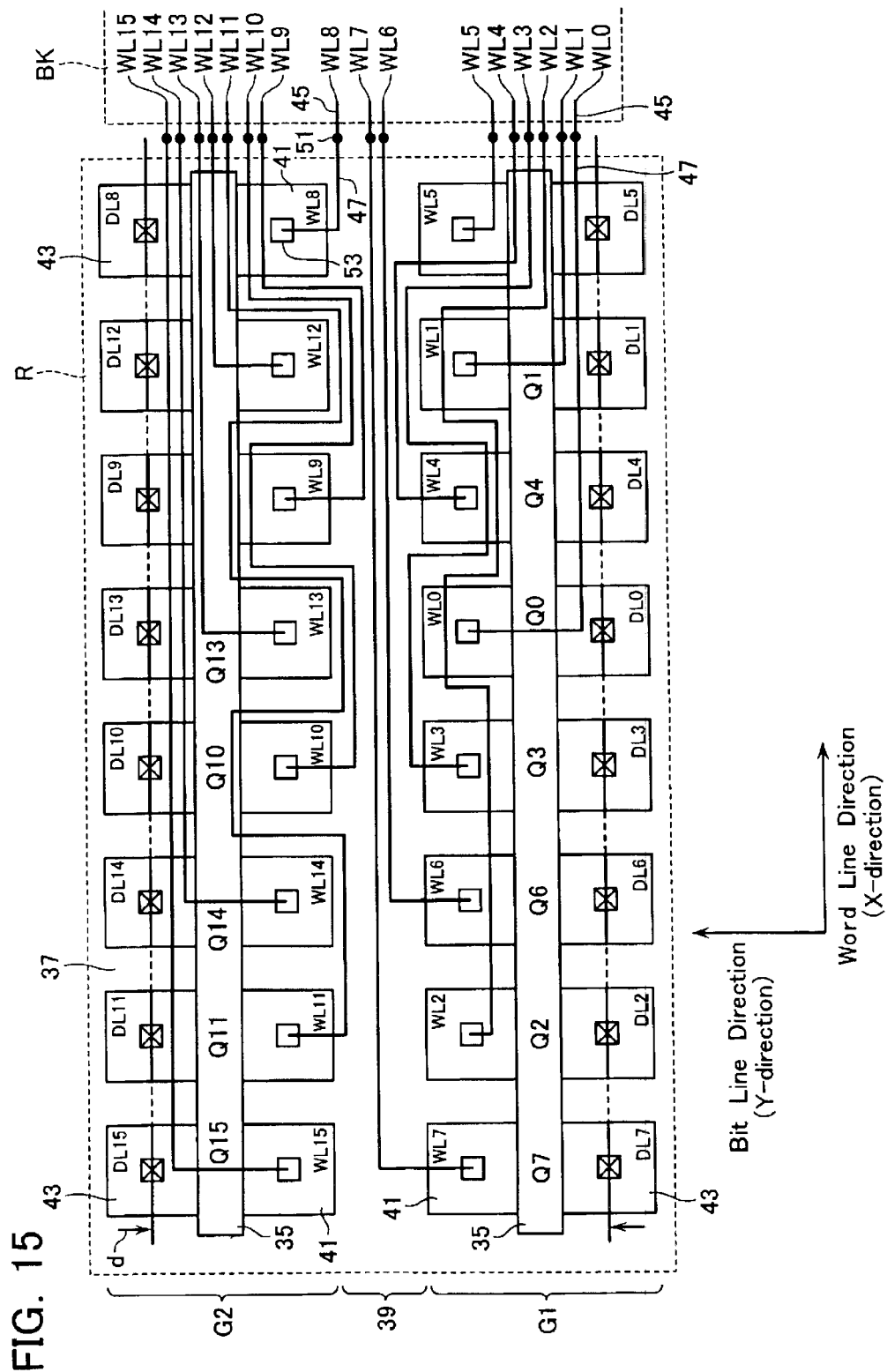
FIG. 15 is a schematic view showing a transfer transistor region according to the first embodiment.

FIG. 15 is a schematic view of a transfer transistor region according to the first embodiment. This figure shows the layout of the transfer transistors Q0–15 and the word lines WL0–15 connected thereto. In the equivalent circuit diagram shown in FIG. 4, the transfer transistors Q0–15 are depicted in line along the extending direction of the bit line BL. In practice, however, the transfer transistors Q0–15 are divided into a group G1 (an example of the first group) and a group G2 (an example of the second group). Each group consists of eight transfer transistors arranged along the extending direction of the word lines WL0–15. The groups G1, 2 are arranged along the extending direction of the bit line BL. In other words, the transfer transistors Q0–15 are divided into two stages and arranged along the extending direction of the bit line BL.

The transfer transistors Q0–15 comprise NMOS transistors formed in the semiconductor substrate 3 of FIG. 1. The transistors Q0–15 each have an impurity region 41 (an example of the first impurity region) connected to the corresponding word line among the word lines WL0–15, and another impurity region 43 (an example of the second impurity region) connected to the corresponding drive line among the drive lines DL0–15. The impurity regions 41, 43 each function as a source/drain. A distance between contacts of drive lines DL in the group G1 and the group G2 is shown as a distance d, which has the same dimension as that along the bit line in the block BK (NAND cell 1).

The transistors Q0–15 are electrically isolated from each other via a device isolation insulator 37. The insulator 37 includes a first device isolation insulator 39 formed between the group G1 and the group G2 in the extending direction of the gate line 35 for the transistors Q0–15 (the extending direction of the word line). The impurity regions 41 of the transfer transistors in the group G1 are formed along the first device isolation insulator 39. These impurity regions 41 are opposed to the impurity regions 41 of the transfer transistors in the group G2 via the first device isolation insulator 39.

Among the word lines WL0–15, a word line arbitrarily determined is defined herein as an arbitrary word line. Word lines located adjacent to two word lines both adjacent to the arbitrary word line are defined as secondary adjacent word lines. Other word lines than the arbitrary word line and secondary adjacent word lines are defined as residual word lines. For example, when the word line WL3 is determined as the arbitrary word line, the secondary adjacent word lines correspond to the word lines WL1, 5, and the residual word lines correspond to the word lines WL0, 2, 4, 6–15.

In the first embodiment, around the transfer transistor Q3, the transfer transistors Q0, 6 are arranged at both adjacent locations and the transfer transistor Q10 at an opposite location. In other words, among a plurality of transfer transistors, it is not the transfer transistors for the secondary adjacent word lines but the transfer transistors for the residual word lines that are arranged at both adjacent locations and an opposite location around the transfer transistor for the arbitrary word line. In other words from the viewpoint of impurity regions, the impurity regions 41 in the transfer transistors for the residual word lines are arranged at both adjacent locations and an opposite location around the impurity region 41 in the transfer transistor for the arbitrary word line.

Figure 16:
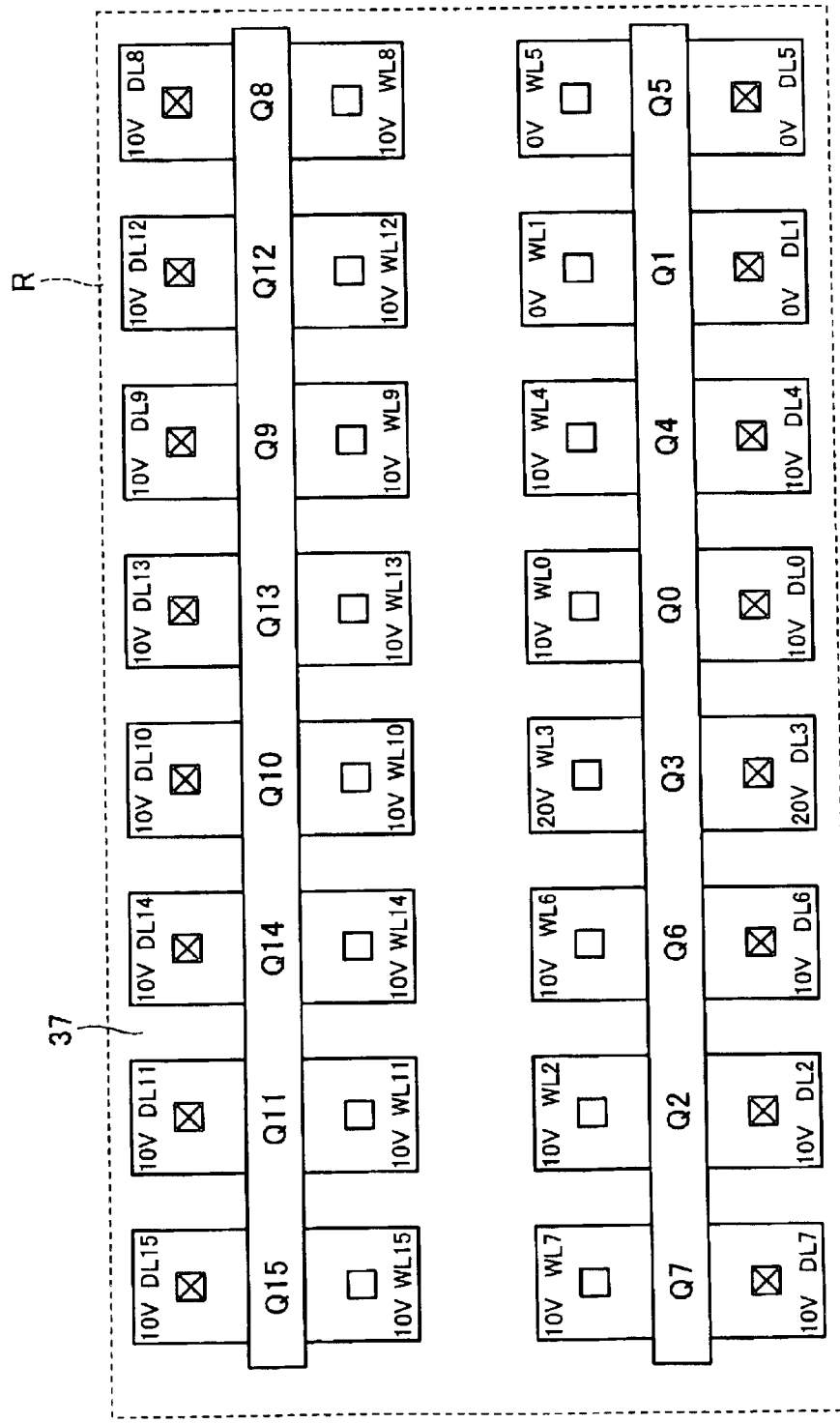
FIG. 16 is a schematic view showing the transfer transistor region of FIG. 15 except for the word lines.
Figure 17:
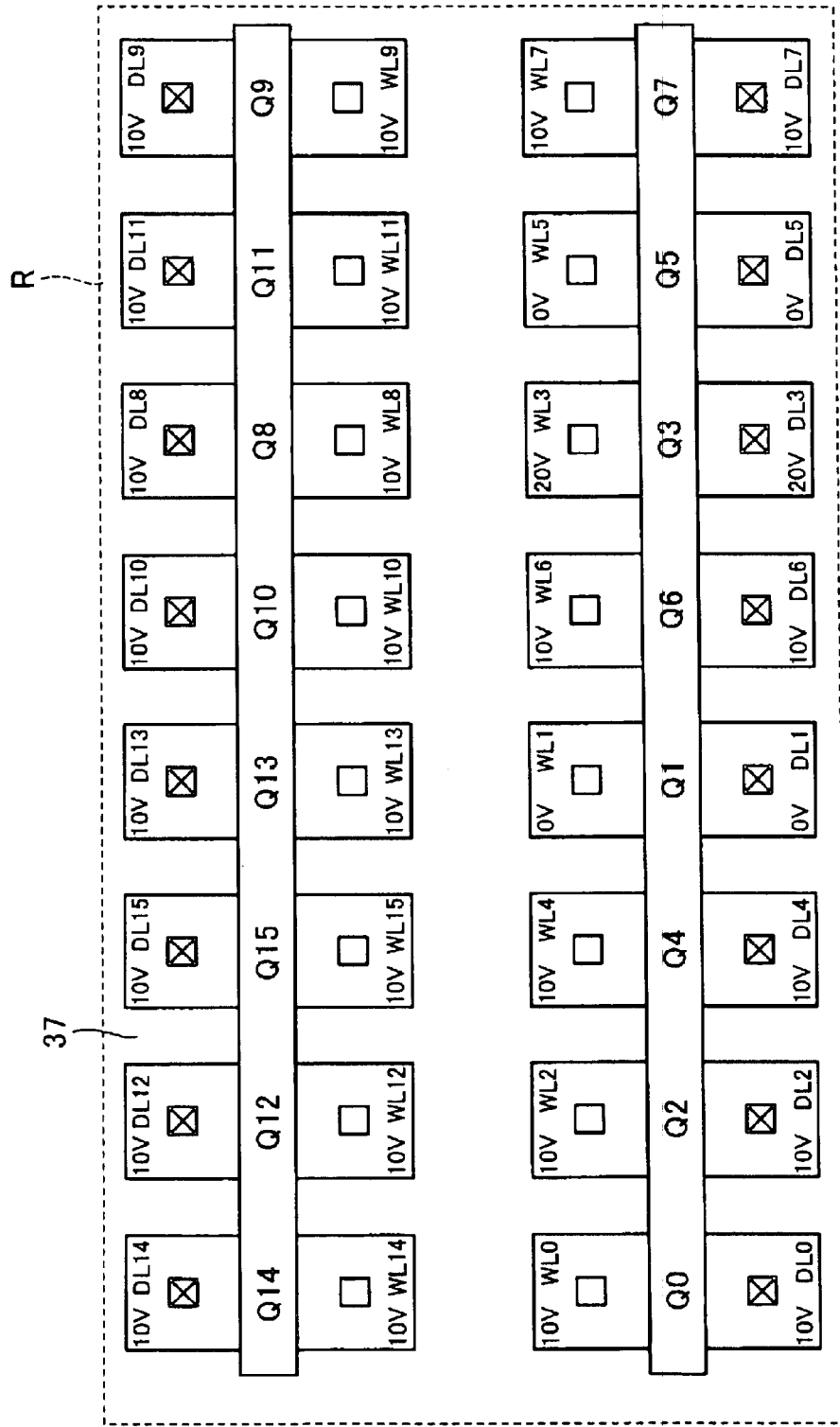
FIG. 17 is a view compared with FIG. 16 to show the case where a voltage of 20V is applied to the word line WL3.
Figure 18:
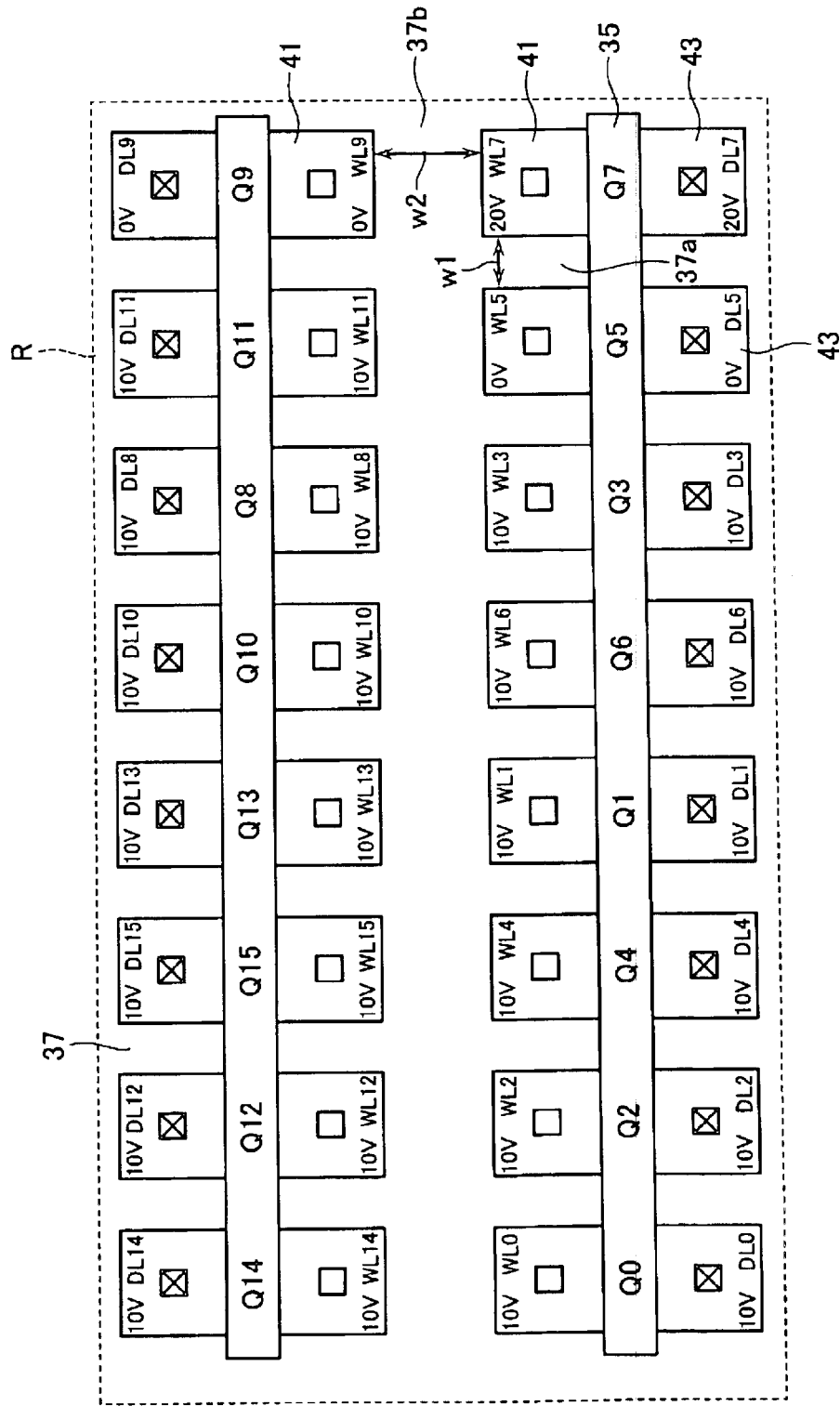
FIG. 18 is a view compared with FIG. 16 to show the case where a voltage of 20V is applied to the word line WL7.

Such the arrangement is effective to prevent the potential to be enlarged between the transfer transistor for the arbitrary word line and the transfer transistor for the word line adjacent or opposite thereto. This is described with reference to FIGS. 16–18. FIG. 16 shows the transfer transistor region R of FIG. 15 except for the word lines WL0–15. FIGS. 17 and 18 are compared with FIG. 16. They are different in the layout of the transfer transistors Q0–15 from FIG. 16. FIGS. 17 and 18 are identical in layout. A voltage of 20V is applied to the word line WL3 in the case shown in FIG. 17. To the contrary, a voltage of 20V is applied to the word line WL7 in FIG. 18.

In the layout of the comparative example shown in FIG. 17, the transfer transistor Q5 is arranged adjacent to the transfer transistor Q3. When the voltage on the word line WL3 is set at 20V to program the memory cell connected to the word line WL3, the voltage on the secondary adjacent word line or the word line WL5 is kept at 0V. Therefore, a potential of 20V is placed across the transfer transistors Q3 and Q5. Thus, the device isolation insulator 37 is required to have dimensions determined to withstand the potential.

Determination of the dimensions of the device isolation insulator 37 is specifically described with reference to FIG. 18. FIG. 18 has the same layout as that of FIG. 17 except that 20V is applied to the word line WL7. The device isolation insulator 37 includes a device isolation insulator 37a between the transfer transistors Q5 and Q7, and a device isolation insulator 37b between the transfer transistors Q7 and Q9.

As the voltage on the word line WL7 is set at 20V, the voltages on the secondary adjacent word lines WL5, 9 are equal to 0V. Around the transfer transistor Q7, the transfer transistor Q5 is arranged at an adjacent location, and the transfer transistor Q9 is arranged at an opposite location. Therefore, a potential of 20V is located across the transfer transistors Q5 and Q7 and across the transfer transistors Q7 and Q9, respectively. Thus, it is required to consider such the situation to determine the dimensions of the device isolation insulator 37.

The gate line 35 on the device isolation insulator 37a serves as a gate electrode of a parasitic transistor. This parasitic transistor is formed in a structure that allows a current to flow between the impurity region 41, 43 of the transistor Q5 and the impurity region 41, 43 of the transistor Q7. It is required to increase the width w1 of the device isolation insulator 37a sufficient to prevent the parasitic transistor from operating or suppress the current flow below a certain value even if the parasitic transistor operates. It is also required to increase the width w2 of the device isolation insulator 37b sufficient to prevent the transfer transistors Q7 and Q9 from causing any dielectric breakdown. If the gate line 35 has a separated structure on a transfer-transistor basis, the gate line 35 is not disposed on the device isolation insulator 37b. In this case, no parasitic transistors are formed. Accordingly, the determination of the width w1 of the device isolation insulator 37a is similarly considered as the determination of the width w2 of the device isolation insulator 37b.

The larger the width w1, the larger the dimension of the transfer transistor region R (that is, the row decoder) along the word line. The width w2 can be increased without any problem if the distance d shown in FIG. 15 is large. When the distance d decreases as the memory cells are fine patterned, the transfer transistors Q0–15 can not be arranged in two stages. In this case, it is required to arrange the transistors in line along the word line. Accordingly, it is difficult to contain the dimension of the transfer transistor region R along the word line within the cell size.

In the first embodiment, to the contrary, the transfer transistors for the residual word lines are arranged at locations adjacent and opposite to the transfer transistor for the arbitrary word line as shown in FIG. 16. For example, around the transfer transistor Q3 for the word line WL3, the transfer transistors Q0, 6 for the word lines WL0, 6 are arranged at both adjacent locations, and the transfer transistor Q10 for the word line WL10 is arranged at an opposite location. Thus, in the first embodiment, the maximum potential difference between adjacent transfer transistors can be suppressed below 10V. Therefore, it is possible to design the dimension of the device isolation insulator 37 smaller compared to the comparative example in FIGS. 17, 18. According to the first embodiment, the transfer transistor region R, or the area of the row decoder, can be reduced to downsize the NAND-type EEPROM. The arrangement of the transfer transistors Q0–15 shown in FIG. 15 is an example. In a word, it is sufficient that the transfer transistors for the residual word lines are arranged at both adjacent locations and an opposite location around the transfer transistor for any arbitrary word lines.

(Characteristic 2)

As shown in FIG. 15, the transfer transistors Q13, 14 are arranged at obliquely opposite locations around the transfer transistor Q3. In a word, the first embodiment has one characteristic on the arrangement of the plurality of transfer transistors, in which the transfer transistors for the residual word lines are arranged at obliquely opposite locations around the transfer transistor for the arbitrary word line. The effect derived from this arrangement is described below.

The transfer transistor arranged at the obliquely opposite location around the transfer transistor for the arbitrary word line has a larger distance from the transfer transistor for the arbitrary word line compared to the transfer transistor arranged at the adjacent or opposite location. Therefore, a relatively larger breakdown voltage can be expected on the device isolation insulator between the transfer transistor for the arbitrary word line and the transfer transistor arranged at the obliquely opposite location.

The distance may not be ensured sufficiently, however, as the memory cells are fine patterned. In this case, the device isolation insulator between them may have a breakdown voltage below 20V possibly. According to the first embodiment, it is possible to prevent a potential of 20V to be placed across the transfer transistor for the arbitrary word line and the transfer transistor arranged at the obliquely opposite location. Therefore, without increasing the area of the transfer transistor region R, the transfer transistor for the arbitrary word line can be isolated reliably from the transfer transistor arranged at the obliquely opposite location.

(Characteristic 3)

In the first embodiment, the transfer transistors for the both word lines adjacent to the arbitrary word line are similarly arranged as the transfer transistors for the secondary adjacent word lines. For example, when the word line WL3 is selected as the arbitrary word line, the transfer transistors Q2, 4 for the word lines WL2, 4 are not arranged at both adjacent locations and an opposite location around the transfer transistor Q3. In other words, arranged at both adjacent locations and an opposite location around the transfer transistor for the arbitrary word line are the transfer transistors for the residual word lines other than the both word lines adjacent to the arbitrary word line.

Accordingly, even in the case of "(2) Comparative Example" in "2. Operation of NAND cell", it is possible to prevent a potential of 20V to be placed across the transfer transistor for the arbitrary word line and the transfer transistors arranged at both adjacent locations and an opposite location. In a word, if the programming method of the comparative example is applied to the NAND-type EEPROM according to the first embodiment, the potential can be prevented to become 20V without varying the arrangement of the transfer transistors.

(Characteristic 4)

As shown in FIG. 15, the word lines WL0–15 comprise control gates 45 and lead wires 47. In one characteristic of the first embodiment, the arranging order of the control gates 45 is identical to the arranging order of the lead wires 47. This characteristic is detailed below.

Figure 19:
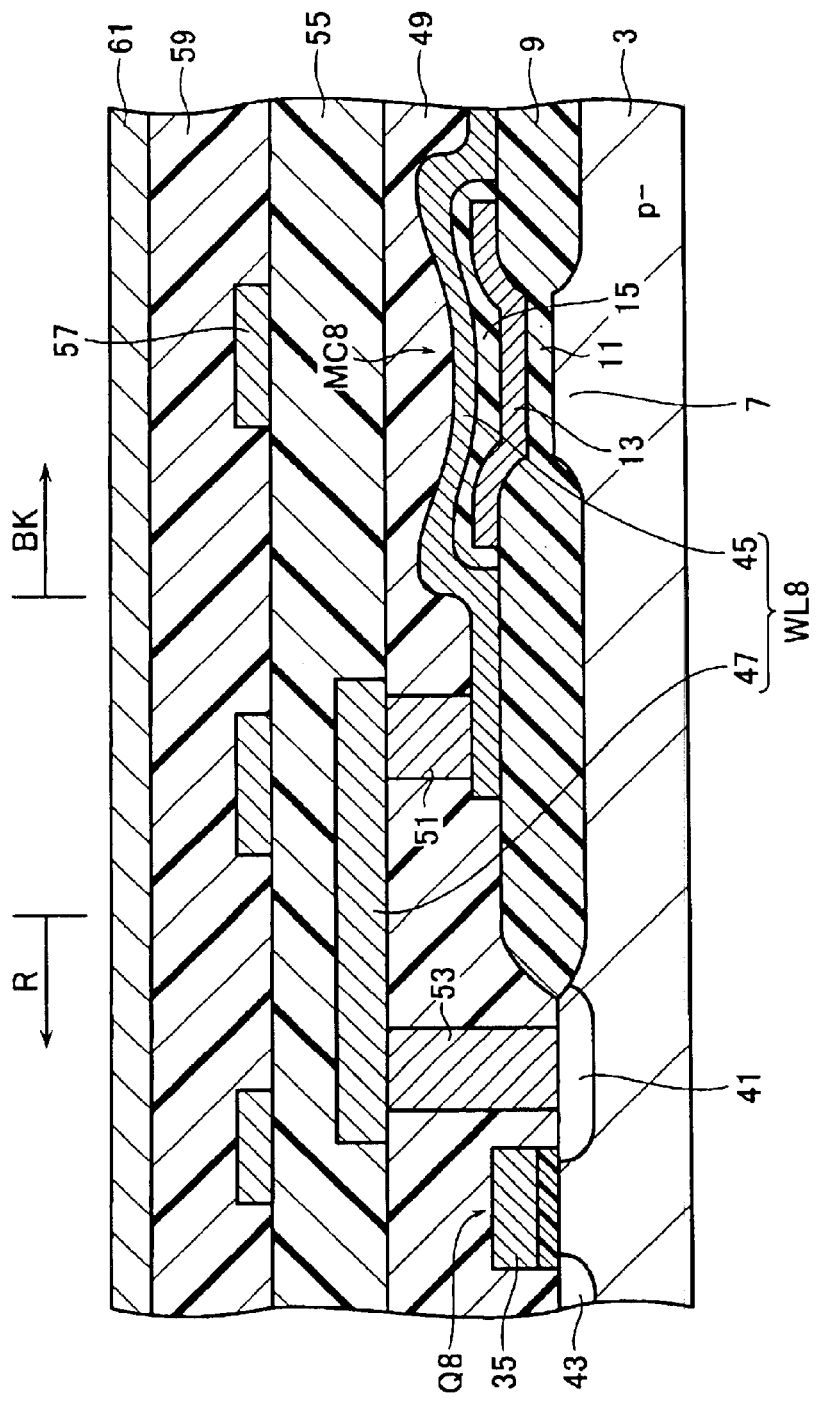
FIG. 19 is a schematic cross-sectional view of a boundary between the transfer transistor region and the block shown in FIG. 15.

FIG. 19 is a schematic cross-sectional view of a boundary between the transfer transistor region R and the block BK shown in FIG. 15. The word line WL8 appears in FIG. 19. An interlayer insulator 49 is formed over the control gate 45 of the word line WL8 and the transfer transistor Q8. The control gate 45 has a stacked structure including films of polysilicon and silicide (for example, WSi). The lead wire 47 is formed on the interlayer insulator 49. An example of material for the lead wire 47 is tungsten. The lead wire 47 has one end connected to the control gate 45 via a plug 51 buried in the interlayer insulator 49, and the other end connected to the impurity region 41 via a plug 53 buried in the interlayer insulator 49. An example of material for the plug is tungsten.

An interlayer insulator 55 is formed over the lead wire 47. Formed on the interlayer insulator 55 is a wire 57 composed of, for example, aluminum. An interlayer insulator 59 is formed over the wire 57. Formed on the interlayer insulator 59 is a wire 61 composed of, for example, aluminum.

As described above, the word line WL0–15 comprises the control gate 45 and the lead wire 47 that is led out of the impurity region 41 (an example of the first impurity region) of the transfer transistor Q0–15 and disposed in an upper layer above the control gate 45.

In the first embodiment, the arranging order of the control gates 45 is identical to the arranging order of the lead wires 47. In a word, the control gates 45 are also arranged in order from the control gate of the word line WL0, through the control gate of the word line WL1, . . . , to the control gate of the word line WL15. Similarly, the lead wires 47 are arranged in order from the lead wire of the word line WL0, through the lead wire of the word line WL1, . . . , to the lead wire of the word line WL15. Thus, the arranging order of the word lines WL0–15 in the block BK is same as that in the transfer transistor region R. Accordingly, the lead wires 47 can be easily connected to the control gates 45 that are designed under the strictest design rules. The material for the lead wire 47 may be copper or aluminum other than tungsten.

(Characteristic 5)

As shown in FIG. 19, the first embodiment is provided with a multi-layered structure that includes a plurality of conductive layers 45, 47, 57, 61 and interlayer insulators 49, 55, 59 interposed therebetween. In the first embodiment, the lead wire 47 is a conductive layer disposed one layer higher than the control gate 45 among the plurality of conductive layers and directly connected to the impurity region 41. This characteristic has the following effect.

In a production process of the semiconductor memory device, the contacts 51, 53 are formed after the formation of the conductive layer 45. In this case, when the conductive layer 45 is charged in the step of etching the contacts, static electricity is built up inevitably. Similarly, the contact for connecting the conductive layers 45 and 57 is formed after the formation of the conductive layers 45, 47. In this case, when the conductive layer 47 is charged in the step of etching the contact, static electricity is built up inevitably. If the static electricity flows into the control gate 45 during the production process, the memory cell may be statically broken down. In the case where the end of the control gate 45 is connected via the lead wire to the impurity region 41, the static electricity flows from the semiconductor substrate 3 through the impurity region 41 to the ground. This is effective to protect the memory cell from electrostatic breakdown.

A further upper conductive layer (wire 57, 61) above the conductive layer disposed one-layer higher than the control gate 45 may be employed to connect the control gate 45 with the impurity region 41. In this case, however, the control gate 45 is kept in a state not connected to the impurity region 41 for a long time in the production process. This state increases the possibility of electrostatic breakdown to the extent. In the first embodiment, only the conductive layer 47 disposed one-layer higher than the control gate 45 is employed to connect the control gate 45 with the impurity region 41. Thus, the conductive layer 47 is directly connected to the impurity region 41 to reduce the possibility of electrostatic breakdown of the memory cell.

SECOND EMBODIMENT

Figure 20:
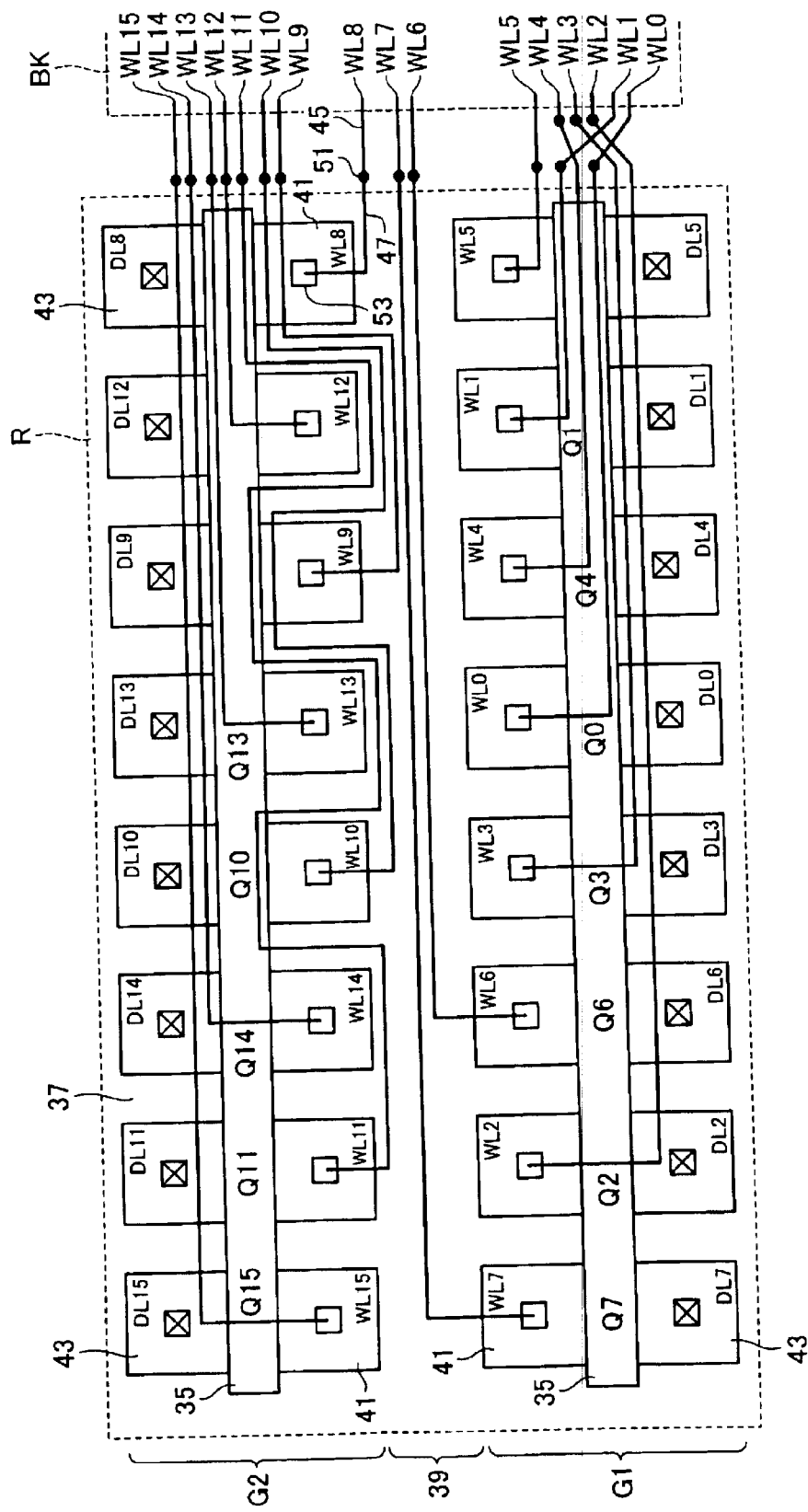
FIG. 20 is a schematic view of a transfer transistor region according to a second embodiment.
Figure 21:
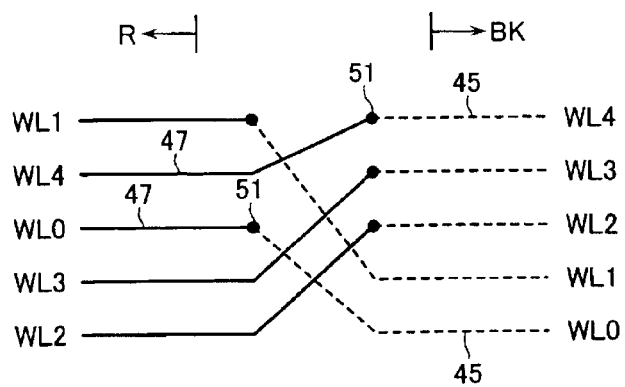
FIG. 21 is an enlarged view of word lines WL0–4 in FIG. 20.

A second embodiment is described next mainly on differences from the first embodiment. FIG. 20 is a schematic view of a transfer transistor region R according to the second embodiment, which corresponds to FIG. 15 in the first embodiment. FIG. 21 is an enlarged view of the word lines WL0–4 in FIG. 20.

In one characteristic of the second embodiment, the arranging order of the control gates 45 is different from the arranging order of the lead wires 47. Consequently, the arranging order of the word lines WL0–15 in the block BK is different from that in the transfer transistor region R. This characteristic is described below.

When attention is given to the word line WL2 in the first embodiment shown in FIG. 15, the transfer transistor Q2 corresponding to the word line WL2 is located deeper in the transfer transistor region R than the transfer transistor Q0 corresponding to the word line WL0 and the transfer transistor Q1 corresponding to the word line WL1 seen from the block BK. Accordingly, the word line WL2 is arranged in a detour to be kept from contact with the word lines WL0, 1.

In the second embodiment, to the contrary, as shown in FIGS. 20, 21, the word line WL2 is located before the word lines WL0, 1 in the transfer transistor region R. Accordingly, the word line WL2 can be arranged without any detour. Thus, it is possible to reduce the number of word lines that pass over the first device isolation insulator 39. Therefore, the word line pitch of the lead wires can include a margin in the transfer transistor region R, which allows the word lines to be formed easily.

In particular, as the first device isolation insulator 39 is increasingly fine patterned, it is possible to reduce the number of the word lines to be arranged thereon. Therefore, a large effect can be expected if the order of the word lines is changed as is in the second embodiment. The changed order of the word lines can be achieved by allowing the control gates 45 to intersect the lead wires 47 three-dimensionally as shown in FIG. 21.

THIRD EMBODIMENT

Figure 22:
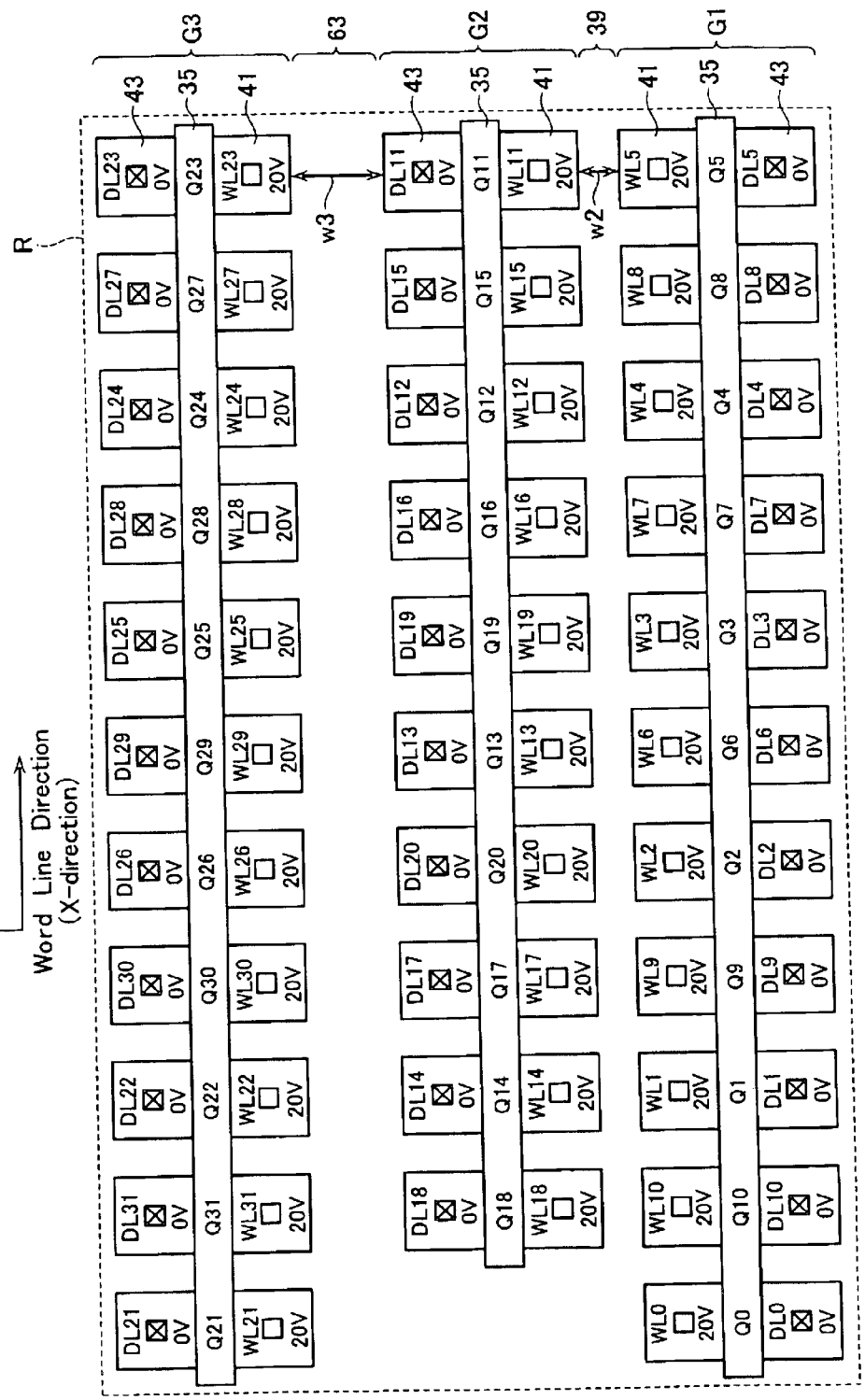
FIG. 22 is a schematic view of a transfer transistor region according to a third embodiment except for word lines.

A third embodiment is described next mainly on differences from the first and second embodiments. FIG. 22 is a schematic view of a transfer transistor region R according to the third embodiment, which corresponds to FIG. 16 in the first embodiment.

The third embodiment is provided with a group G3 (an example of the third group) in addition to the group G1 (an example of the first group) and the group G2 (an example of the second group). A second device isolation insulator 63 is disposed between the group G3 and the group G2. It has a larger width w3 than the width w2 of the first device isolation insulator 39. This characteristic is effective to achieve a compatibility to reduce the area of the transfer transistor region R and isolate the transfer transistors from each other. The characteristic of the third embodiment is described below in detail.

The number of the memory cells for configuring the NAND cell 1 (FIG. 3) is equal to 16 in the first and second embodiments while it is equal to 32 in the third embodiment. Accordingly, the number of the transfer transistors Q is also equal to 32. If the 32 transfer transistors Q are divided into and arranged in the groups G1, 2, the dimension of the transfer transistor region R along the word line becomes larger. As the number of the memory cells is equal to 32, the dimension of the NAND cell along the bit line becomes larger, and subsequently the dimension of the region R along the bit line also becomes larger. Consequently, in the third embodiment, the transfer transistors Q are divided into the groups G1–3 and arranged in three stages.

The impurity region 41 (an example of the first impurity region) of the transfer transistor in the group G3 opposes to the impurity region 43 (an example of the second impurity region) of the transfer transistor in the group G2 via the second device isolation insulator 63 formed in the extending direction of the gate line 35.

In the NAND-type, the data programmed in the memory cells can be erased on a block BK basis. In a word, the data programmed in the memory cells in the selected block BK can be erased in a batch. FIG. 22 shows voltages on the transfer transistors Q which transfer the voltages to the word lines WL in the non-selected blocks BK for data erase.

For data erase, the voltage on the drive line DL is set at 0V, and the voltage on the semiconductor substrate 3 (FIG. 3) is set at 20V. As the gate line 35 for the transfer transistors Q corresponding to the non-selected blocks BK is kept at 0V, the transfer transistors Q are turned off. Therefore, the impurity region 41 is in a floating state at 20V approximately equal to the voltage on the semiconductor substrate 3 through capacitive coupling. On the other hand, the impurity region 43 is at 0V equal to the voltage on the drive line DL.

As described above, for data erase, some locations have a potential of 20V in the transfer transistor region R corresponding to the non-selected block BK. Therefore, in the third embodiment, the second device isolation insulator 63 is designed to have a relatively larger width w3. This is effective to isolate the transfer transistors in the group G2 from those in the group G3, and reduce the leakage from the impurity region 41 (20V) in the group G3 to the impurity region 43 (0V) in the group G2. If the leakage is large, it enlarges the potential difference between the word line for the memory cell and the semiconductor substrate because the impurity region in the group G3 is floated, and causes failed erase. According to the third embodiment, the leakage can be reduced to prevent the failed erase subsequently. As described above in the third embodiment, the second device isolation insulator 63 has a larger width w3. As described in the first and second embodiments, to the contrary, the first device isolation insulator 39 can be designed to have a smaller width w2. Therefore, it is possible to prevent the dimension of the transfer transistor region R from enlarging along the bit line.

As can be seen from the reference numerals given to the word lines and drive lines in the third embodiment shown in FIG. 22, the transfer transistors for the residual word lines are arranged at adjacent, opposite and obliquely opposite locations around the transfer transistor for any arbitrary word lines like the preceding embodiments.

The aforementioned embodiments are merely examples and hence do not restrict the present invention. Although a NAND-type flash memory device is explained in the above-described embodiments, the present invention is applicable to, for example, non-volatile semiconductor memory devices of an AND-type, a DINOR-type, and the like.

As obvious from the foregoing, in the non-volatile semiconductor memory device according to the present invention, it is not the transfer transistors for the secondary adjacent word lines but the transfer transistors for the residual word lines that are arranged at adjacent and opposite locations around the transfer transistor for the arbitrary word line. Therefore, it is possible to reduce the potential between adjacent transfer transistors. This is effective to reduce the dimension of the device isolation insulator disposed to isolate transfer transistors from each other, and accordingly reduce the region for arranging the transfer transistors.

APPLICATIONS TO ELECTRONIC CARD AND ELECTRONIC DEVICE

As an embodiment, an electronic card using the non-volatile semiconductor memory devices according to the above-described embodiments of the present invention and an electronic device using the card will be described bellow.

Figure 23:
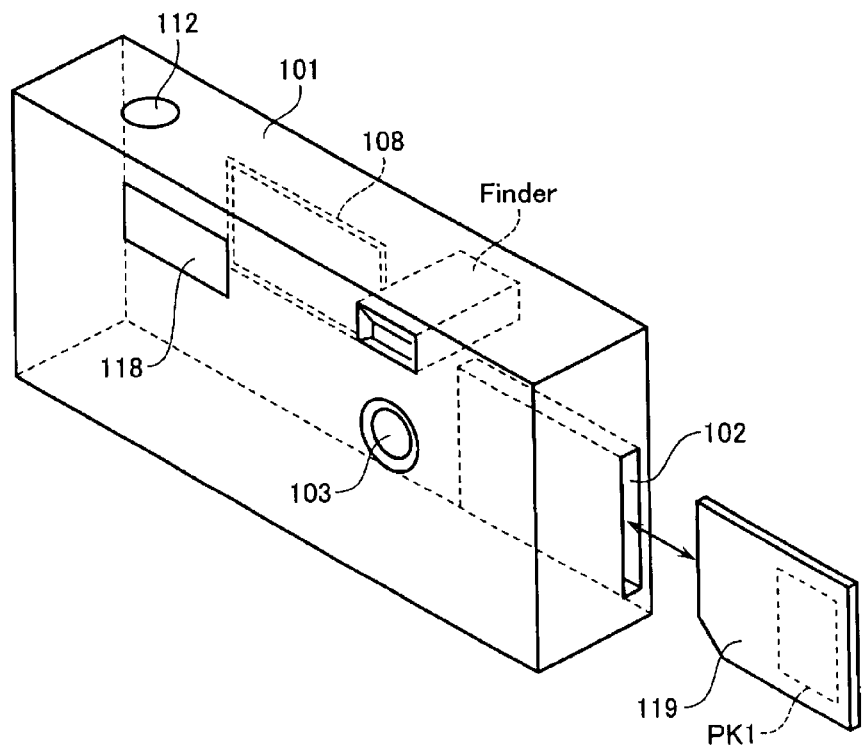
FIG. 23 shows another embodiment applied to a digital still camera.

FIG. 23 shows an electronic card according to this embodiment and an arrangement of an electronic device using this card. This electronic device is a digital still camera 101 as an example of portable electronic devices. The electronic card is a memory card 51 used as a recording medium of the digital still camera 101. The memory card 51 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 51 is detachably inserted into the card slot 102 of the digital still camera 101. When inserted in the slot 102, the memory card 51 is electrically connected to electric circuits of the circuit board.

If this electronic card is a non-contact type IC card, it is electrically connected to the electric circuits on the circuit board by radio signals when inserted in or approached to the card slot 102.

Figure 24:
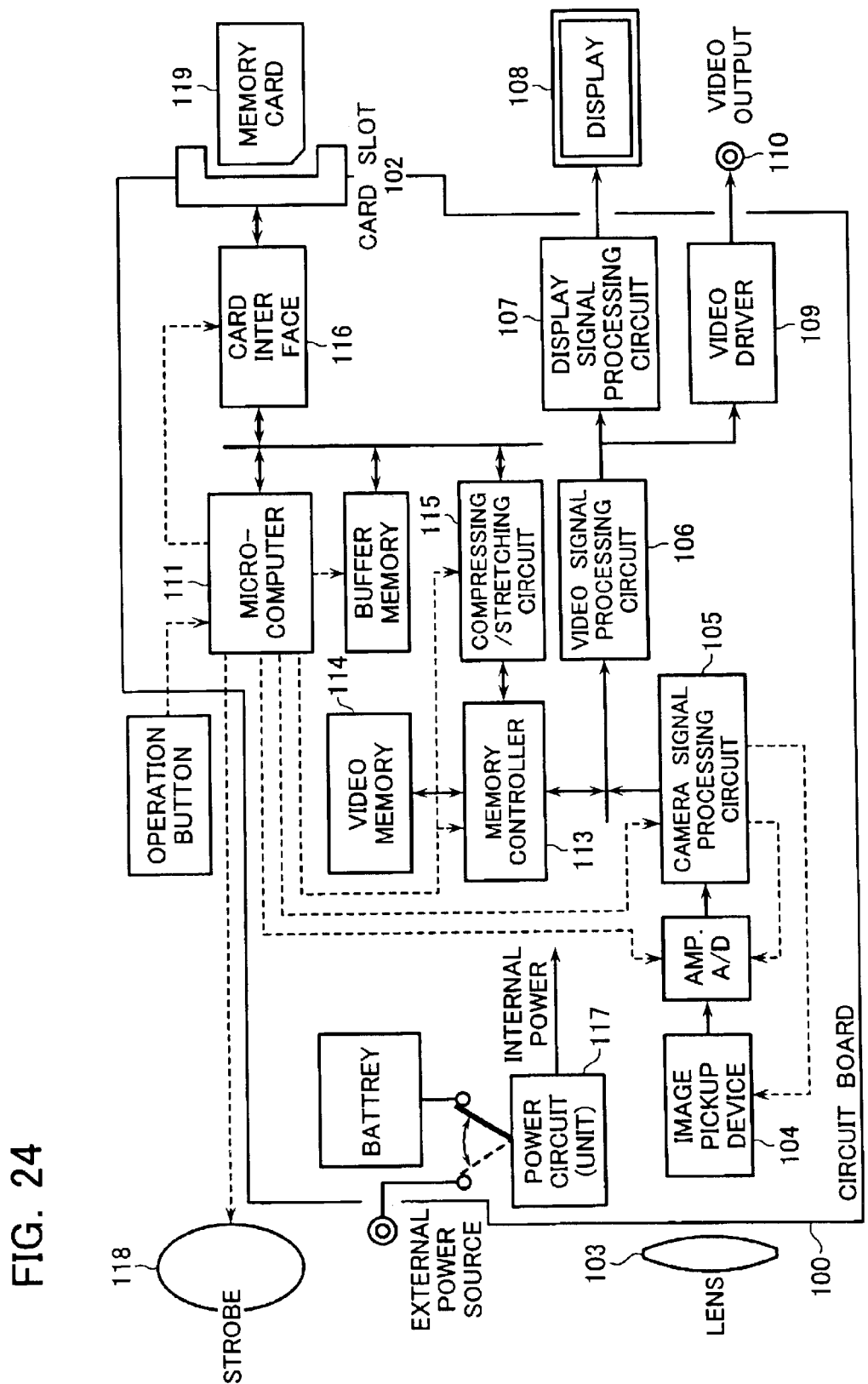
FIG. 24 shows the internal configuration of the digital still camera.

FIG. 24 shows a basic arrangement of the digital still camera. Light from an object is converged by a lens 103 and input to an image pickup device 104. The image pickup device 104 is, for example, a CMOS sensor and photoelectrically converts the input light into, for example, an analog output signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., of NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, the analog amplifier (AMP), the A/D converter (A/D), and the camera signal processing circuit 105.

To capture an image, an operator presses an operation button such as a shutter button 112. In response to this operation, the microcomputer 111 controls a memory controller 113 to write the output signal from the camera signal processing circuit 105 into a video memory 114 as a frame image. The frame image written in the video memory 114 is compressed on the basis of a predetermined compression format by a compressing/stretching circuit 115. The compressed image is recorded, via a card interface 116, on the memory card 51 inserted in the card slot.

To reproduce a recorded image, an image recorded on the memory card 51 is read out via the card interface 116, stretched by the compressing/stretching circuit 115, and written into the video memory 114. The written image is input to the video signal processing circuit 106 and displayed on the display 108 or another image apparatus in the same manner as when the image is monitored.

In this arrangement, mounted on the circuit board 100 are the card slot 102, the image pickup device 104, the analog amplifier (AMP), the A/D converter (A/D), the camera signal processing circuit 105, the video signal processing circuit 106, the display signal processing circuit 107, the video driver 109, the microcomputer 111, the memory controller 113, the video memory 114, the compressing/stretching circuit 115, and the card interface 116.

The card slot 102 is not mounted on the circuit board 100 necessarily, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

Figure 25A:
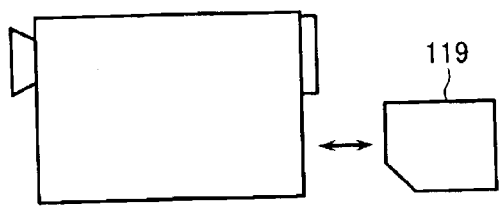
FIGS. 25A to 25J show other electronic devices to which the embodiment is applied.
Figure 25F:
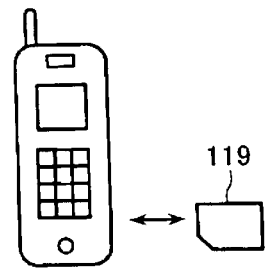
Figure 25B:
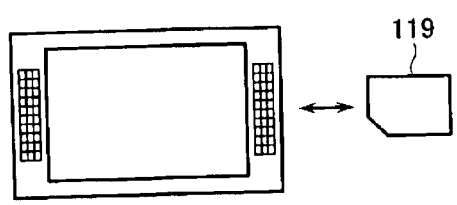
Figure 25G:
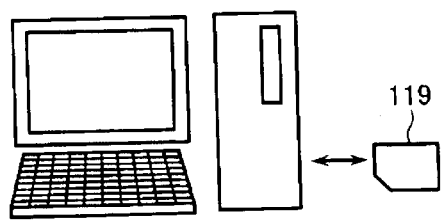
Figure 25C:
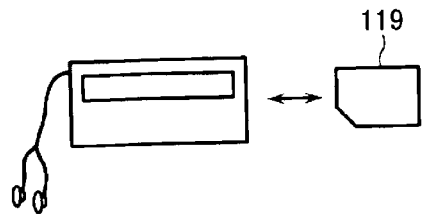
Figure 25H:
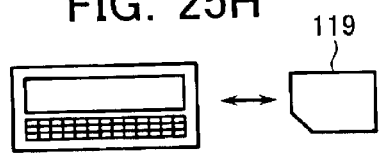
Figure 25D:
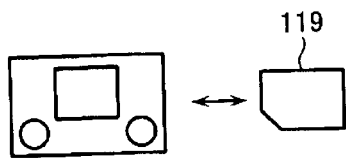
Figure 25I:
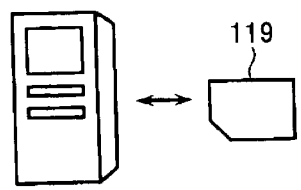
Figure 25E:
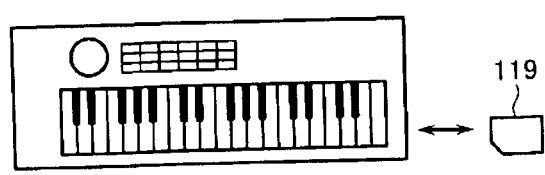
Figure 25J:
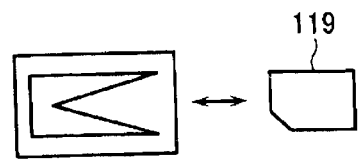

As described above, the electronic card according to this embodiment can be used in portable electronic devices such as the digital still camera explained above. However, the electronic card can also be used in various apparatus such as those shown in FIGS. 25A to 25J, as well as in portable electronic devices. That is, the electronic card can also be used in a video camera shown in FIG. 25A, a television set shown in FIG. 25B, an audio apparatus shown in FIG. 25C, a game apparatus shown in FIG. 25D, an electronic musical instrument shown in FIG. 25E, a cell phone shown in FIG. 25F, a personal computer shown in FIG. 25G, a personal digital assistant (PDA) shown in FIG. 25H, a voice recorder shown in FIG. 25I, and a PC card shown in FIG. 25J.

While the present invention has been particularly shown and described with reference to the embodiments, it will be understood by those skilled in the art that various changes in form and detail may be made without departing from the spirit, scope, and teachings of the invention.

What is claimed is:

1. A non-volatile semiconductor memory device, comprising:
    a memory cell array including a plurality of electrically erasable programmable non-volatile memory cells arrayed and divided into a plurality of blocks;
    a plurality of word lines arranged in each of said plurality of blocks and each commonly connected to memory cells on an identical row;
    a plurality of drive lines provided corresponding to said plurality of word lines and each arranged to supply a voltage to the corresponding word line;
    a plurality of transfer transistors each operative as a switch to connect the corresponding word line to the corresponding drive line among said plurality of word lines and said plurality of drive lines,
    wherein said plurality of word lines are classified into an arbitrary word line determined arbitrarily, secondary adjacent word lines located adjacent to both word lines adjacent to said arbitrary word line, and residual word lines other than said arbitrary word line and said secondary adjacent word lines, and
    wherein among said plurality of transfer transistors, transfer transistors for said residual word lines are arranged at both adjacent locations and an opposite location around a transfer transistor for said arbitrary word line.

2. The non-volatile semiconductor memory device according to claim 1, further comprising a first device isolation insulator formed along an extending direction of a gate line for said plurality of transfer transistors,
    wherein said plurality of transfer transistors each include a first impurity region connected to the corresponding word line among said plurality of word lines and a second impurity region connected to the corresponding drive line among said plurality of drive lines,
    wherein said plurality of transfer transistors are divided into a first group consisting of transfer transistors having said first impurity regions formed along said first device isolation insulator, and a second group consisting of transfer transistors having said first impurity regions formed as opposed to said first impurity regions of said first group via said first device isolation insulator, and
    wherein said first impurity regions of said transfer transistors for said residual word lines are arranged at both adjacent locations and an opposite location around said first impurity region of said transfer transistor for said arbitrary word line.

3. The non-volatile semiconductor memory device according to claim 2, wherein said plurality of word lines each include a control gate of the corresponding memory cell among said plurality of memory cells, and a lead wire led out of said first impurity region of the corresponding transfer transistor among said plurality of transfer transistors and located on an upper layer above said control gate, and
    wherein said control gates and said lead wires are arranged in the same order.

4. The non-volatile semiconductor memory device according to claim 3, further comprising a multi-layered structure including a plurality of conductive layers and interlayer insulators interposed therebetween, wherein said lead wire is composed of a conductive layer disposed one-layer higher than said control gate among said plurality of conductive layers.

5. The non-volatile semiconductor memory device according to claim 2, wherein said plurality of word lines each include a control gate of the corresponding memory cell among said plurality of memory cells, and a lead wire led out of said first impurity region of the corresponding transfer transistor among said plurality of transfer transistors and located on an upper layer above said control gate, and
    wherein said control gates and said lead wires are arranged in different orders.

6. The non-volatile semiconductor memory device according to claim 5, further comprising a multi-layered structure including a plurality of conductive layers and interlayer insulators interposed therebetween, wherein said lead wire is composed of a conductive layer disposed one-layer higher than said control gate among said plurality of conductive layers.

7. The non-volatile semiconductor memory device according to claim 2, further comprising a second device isolation insulator formed along said extending direction of said gate line for said plurality of transfer transistors and having a larger width compared to said first device isolation insulator,
    wherein said plurality of transfer transistors are divided into a third group in addition to said first and second groups, said third group consisting of transfer transistors having said first impurity regions formed as opposed to said second impurity regions in said second group via said second device isolation insulator.

8. The non-volatile semiconductor memory device according to claim 1, wherein among said plurality of transfer transistors, a transfer transistor for said residual word line is arranged at an obliquely opposite location around said transfer transistor for said arbitrary word line.

9. The non-volatile semiconductor memory device according to claim 1, wherein among said plurality of transfer transistors, transfer transistors for said residual word lines other than both word lines located adjacent to said arbitrary word line are arranged at both adjacent locations and the opposite location around said transfer transistor for said arbitrary word line.

10. The non-volatile semiconductor memory device according to claim 1, wherein said non-volatile semiconductor memory device comprises a NAND-type EEPROM.

11. An electronic card including said non-volatile semiconductor memory device according to claim 1 as mounted thereon.

12. An electronic device, comprising:
a card interface;
a card slot connected to said card interface; and
said electronic card according to claim 11 electrically connectable to said card slot.

13. The electronic device according to claim 12, wherein said electronic device comprises a digital camera.

14. A non-volatile semiconductor memory device, comprising:
- a memory cell array including a plurality of electrically erasable programmable non-volatile memory cells arrayed and divided into a plurality of blocks;
- a plurality of word lines arranged in each of said plurality of blocks and each commonly connected to memory cells on an identical row, and being classified into an arbitrary word line determined arbitrarily, secondary adjacent word lines located adjacent to both word lines adjacent to said arbitrary word line, and residual word lines other than said arbitrary word line and said secondary adjacent word lines;
- a plurality of drive lines provided corresponding to said plurality of word lines and each arranged to supply a voltage to the corresponding word line;
- a plurality of transfer transistors each operative as a switch to connect the corresponding word line to the corresponding drive line among said plurality of word lines and said plurality of drive lines, and being arranged transfer transistors for said residual word lines at both adjacent locations and an opposite location around a transfer transistor for said arbitrary word line among said plurality of transfer transistors.

* * * * *